(12) United States Patent
Ebihara

(10) Patent No.: US 12,471,328 B2
(45) Date of Patent: Nov. 11, 2025

(54) SEMICONDUCTOR DEVICE, ELECTRIC POWER CONVERSION DEVICE, AND METHOD FOR MANUFACTURING SEMICONDUCTOR DEVICE

(71) Applicant: Mitsubishi Electric Corporation, Tokyo (JP)

(72) Inventor: Kohei Ebihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 298 days.

(21) Appl. No.: 18/366,320

(22) Filed: Aug. 7, 2023

(65) Prior Publication Data

US 2024/0274655 A1 Aug. 15, 2024

(30) Foreign Application Priority Data

Feb. 10, 2023 (JP) .................. 2023-019329

(51) Int. Cl.
*H10D 62/10* (2025.01)
*H01L 21/311* (2006.01)
(Continued)

(52) U.S. Cl.
CPC ..... *H10D 62/106* (2025.01); *H01L 21/31144* (2013.01); *H01L 23/3171* (2013.01);
(Continued)

(58) Field of Classification Search
CPC .... H10D 62/106; H10D 62/117; H10D 64/01; H10D 84/146; H10D 30/665;
(Continued)

(56) References Cited

U.S. PATENT DOCUMENTS

2012/0061721 A1* 3/2012 Kimura ................ H10D 30/665
257/133
2012/0098064 A1* 4/2012 Onishi ................ H10D 62/111
257/341
(Continued)

FOREIGN PATENT DOCUMENTS

JP      2012-060017 A    3/2012
WO      2018/038133 A1   3/2018
WO      2018/207449 A1   11/2018

*Primary Examiner* — Yemane Mehari
(74) *Attorney, Agent, or Firm* — Studebaker Brackett PLLC

(57) ABSTRACT

A semiconductor device includes: a semiconductor substrate having a drift layer of a first conductivity type; an active region in which a main current flows in a thickness direction of the semiconductor substrate; a terminal region of a second conductivity type formed in a surface layer of the drift layer and surrounding the active region; a covering material covering the terminal region; and a peripheral well region of a first conductivity type formed in the surface layer of the drift layer on an outer side of the terminal region and having an impurity concentration higher than that of the drift layer, wherein a peripheral end of the covering material is arranged on an inner side of a peripheral end of the semiconductor substrate, and the peripheral well region is at least partially formed under the covering material and not formed under a peripheral end of the covering material.

15 Claims, 12 Drawing Sheets

(51) Int. Cl.
*H01L 23/31* (2006.01)
*H10D 30/66* (2025.01)
*H10D 64/01* (2025.01)
*H10D 84/00* (2025.01)
*H02M 7/5387* (2007.01)
*H10D 62/832* (2025.01)

(52) U.S. Cl.
CPC ...... *H01L 23/3178* (2013.01); *H01L 23/3192* (2013.01); *H10D 30/665* (2025.01); *H10D 30/668* (2025.01); *H10D 62/117* (2025.01); *H10D 64/01* (2025.01); *H10D 84/146* (2025.01); *H01L 21/31111* (2013.01); *H02M 7/53871* (2013.01); *H10D 62/8325* (2025.01)

(58) Field of Classification Search
CPC .............. H10D 30/668; H10D 62/8325; H01L 21/31111; H01L 21/31144; H01L 23/3171; H01L 23/3178; H01L 23/3192; H02M 7/53871
USPC ......................................................... 323/132
See application file for complete search history.

(56) References Cited

U.S. PATENT DOCUMENTS

| | | | |
|---|---|---|---|
| 2020/0194561 A1* | 6/2020 | Hikasa | H10D 62/105 |
| 2021/0143272 A1 | 5/2021 | Ebihara et al. | |
| 2021/0399144 A1* | 12/2021 | Ebihara | H01L 23/3192 |
| 2022/0149163 A1* | 5/2022 | Ebihara | H10D 64/252 |

\* cited by examiner

SEMICONDUCTOR DEVICE, ELECTRIC POWER CONVERSION DEVICE, AND METHOD FOR MANUFACTURING SEMICONDUCTOR DEVICE

BACKGROUND OF THE INVENTION

Field

The present disclosure relates to a semiconductor device, an electric power conversion device, and a method for manufacturing a semiconductor device.

In a vertical semiconductor device to be used for a power device, for example, a p-type guard ring region is formed in what is called a terminal region in a peripheral portion of an n-type semiconductor layer in order to ensure withstand voltage performance. The guard ring region is also called a terminal well region. An electrical field is generated when a reverse voltage is applied to a main electrode, but is reduced by a depletion layer formed by a pn junction between the n-type semiconductor layer and the p-type guard ring region.

For example, a structure is disclosed (for example, see Patent Literature 1) in which a channel stopper layer is formed around a peripheral end of the semiconductor device in order to prevent the depletion layer from excessively spreading from the p-type guard ring region, and an n$^+$ source layer connected to the channel stopper layer extends to a peripheral end of a semiconductor substrate. This structure allows a potential to be kept constant around the peripheral end of the semiconductor device, and allows the electrical field to be reduced more effectively.

CITATION LIST

Patent Literature

Patent Literature 1: JP 2012-60017 A

SUMMARY

Technical Problem

There is a case in which a protection film of polyimide, for example, is formed on the substrate in such a semiconductor device, or the semiconductor device is sealed with resin. In a humid state, resin or polyimide contains moisture and a front surface of the semiconductor substrate is exposed to moisture in some cases. When a high voltage is applied in this state, metal that is left when the semiconductor device is fabricated and moisture react with each other so that a metal oxide is deposited, or semiconductor and moisture react with each other with metal serving as a catalyst so that a semiconductor oxide is deposited due to a strong ionization effect particularly in a region in which an n' layer is formed in the surface of the semiconductor substrate. When a foreign substance is deposited on the surface of the semiconductor substrate in this manner, film peeling occurs in the surroundings, or a leak path different from that in an operation of a typical semiconductor device is formed. As a result, insulation reliability of the semiconductor device is impaired in some cases.

An object of the present disclosure, which has been made to solve problems as described above, is to obtain a semiconductor device that enables insulation reliability to be kept, a power conversion device, and a method for manufacturing the semiconductor device.

Solution to Problem

A semiconductor device according to the present disclosure includes: a semiconductor substrate having a drift layer of a first conductivity type: an active region in which a main current flows in a thickness direction of the semiconductor substrate; a terminal region of a second conductivity type formed in a surface layer of the drift layer and surrounding the active region: a covering material covering the terminal region; and a peripheral well region of a first conductivity type formed in the surface layer of the drift layer on an outer side of the terminal region and having an impurity concentration higher than that of the drift layer, wherein a peripheral end of the covering material is arranged on an inner side of a peripheral end of the semiconductor substrate, and the peripheral well region is at least partially formed under the covering material and not formed under a peripheral end of the covering material.

Advantageous Effects of Invention

In the present disclosure, the peripheral well region of a first conductivity type having an impurity concentration higher than that of the drift layer is formed in the surface layer of the drift layer on the outer side of the terminal region, is at least partially formed under the covering material and not formed under the peripheral end of the covering material. Insulation reliability can therefore be kept.

DESCRIPTION OF EMBODIMENTS

Figure 1:
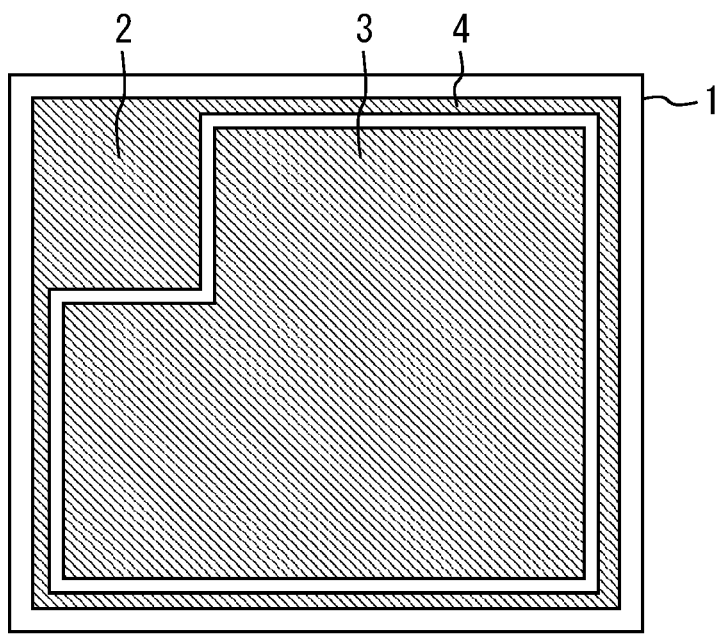
FIG. 1 is a top view showing a semiconductor device according to a first embodiment.

A semiconductor device, a power conversion device, and a method for manufacturing the semiconductor device according to an embodiment will be described with reference to the drawings. The same or corresponding constituent elements are denoted by the same reference numerals, and repeated description may be omitted. The drawings are schematically shown, and a mutual relationship between sizes and positions of images respectively shown in different drawings is not necessarily illustrated accurately and may be changed as appropriate. Conductivity types of semiconductor are denoted by n and p. Although description will be made in the present disclosure assuming that a first conductivity type is the n-type and a second conductivity type is the p-type, the first conductivity type may be the p-type, and the second conductivity type may be the n-type. In addition, $n^-$ indicates that an impurity concentration is lower than n, and $n^+$ indicates that the impurity concentration is higher than n. Similarly, $p^-$ indicates that the impurity concentration is lower than p, and $p^+$ indicates that the impurity concentration is higher than p.

First Embodiment

FIG. 1 is a top view showing a semiconductor device according to a first embodiment. This semiconductor device is a MOSFET. A gate pad 2 is formed on part of a front surface (a first principal surface) of a semiconductor substrate 1. A source electrode 3 is formed adjacent to a gate pad 2. A gate line 4 is formed to extend from the gate pad 2. Note that other constituent elements on an upper surface of the MOSFET are omitted in FIG. 1 for convenience of description.

Figure 2:
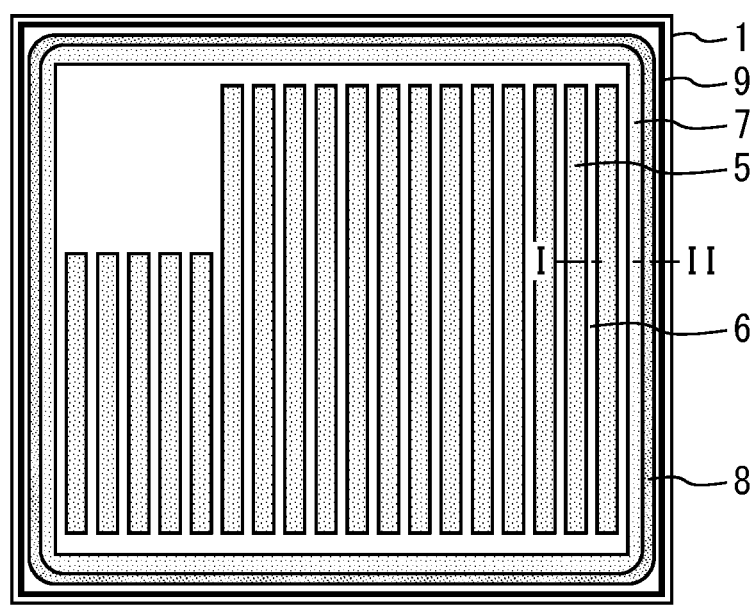
FIG. 2 is a top view showing a semiconductor portion of the semiconductor device according to the first embodiment.

FIG. 2 is a top view showing a semiconductor portion of the semiconductor device according to the first embodiment. Unit cell regions, each being composed of a p-type well region 5 and an n-type separation region 6, are repeatedly arranged in stripes in plan view. A region in which the well regions 5 are formed is called an active region. A region in which a p-type well region 7 and a JTE region 8 are formed in a manner surrounding the active region is called a terminal region.

Figure 3:
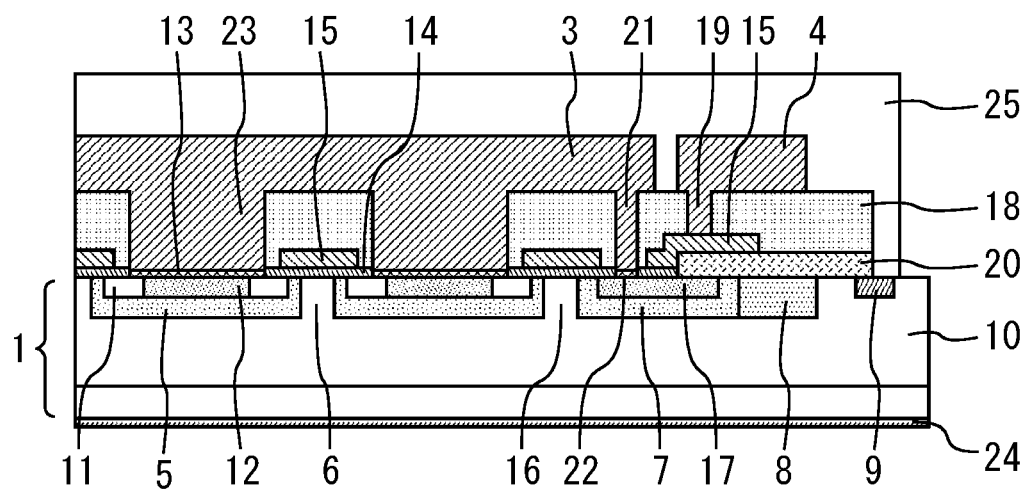
FIG. 3 is a sectional view taken along I-II in FIG. 2.

FIG. 3 is a sectional view taken along I-II in FIG. 2. The semiconductor substrate 1 has an n-type drift layer 10. An active region in which a main current flows in a thickness direction of the semiconductor substrate 1 is formed below the source electrode 3. The plurality of p-type well regions 5 in stripes are formed in a surface layer of the drift layer 10 in the active region. The plurality of well regions 5 may be connected to each other, or may be separate from each other. In a case where the plane orientation of the front surface of the semiconductor substrate 1 is a (0001) plane having an off angle in the <11-20> direction, the well regions 5 in stripes may be formed in parallel to the <11-20> direction, or may be formed in parallel to a direction orthogonal to an off direction.

In a surface layer of each of the well regions 5, an n-type source region 11 is formed at a position on the inner side from the periphery of the well region 5 by a predetermined distance. In the surface layer of each of the well regions 5, a low-resistance p-type contact region 12 is formed on the further inner side of the source region 11.

An ohmic electrode 13 is formed on the n-type source region 11 and the p-type contact region 12. The source electrode 3 is formed on the ohmic electrode 13. The ohmic electrode 13 is formed by siliciding Ni, for example, after being formed. The source electrode 3 is formed of a thick film of aluminum, for example. The p-type well region 5 can easily exchange electrons and holes with the ohmic electrode 13 via the low-resistance p-type contact region 12.

A region of the drift layer 10 between adjacent ones of the well regions 5 is the n-type separation region 6. The n-type impurity concentration of the separation region 6 may be the same as the n-type impurity concentration of the drift layer 10, or may be higher or lower than the n-type impurity concentration of the drift layer 10. A gate insulating film 14 made of silicon oxide is formed on front surfaces of the adjacent ones of the well regions 5, the separation region 6 therebetween, and the source region 11 in each of the well regions 5. A gate electrode 15 made of polysilicon is formed on the gate insulating film 14 at least above the well region 5. A surface layer of the well region 5 opposite to the gate electrode 15 with the gate insulating film 14 interposed therebetween is called a channel region.

The p-type well region 7 is formed in the surface layer of the drift layer 10 on the outer side of the outermost well region 5. A region between the well region 5 and the well region 7 in the drift layer 10 is an n-type separation region 16. The n-type impurity concentration of the separation region 16 may be the same as the n-type impurity concentration of the drift layer 10, or may be higher or lower than the n-type impurity concentration of the drift layer 10.

The gate insulating film 14 is also formed on the well region 7. The gate electrode 15 is formed on the gate insulating film 14 at least above the well region 7. The gate electrode 15 extends in the stripe direction in plan view, and has an end connected to the gate line 4 above the well region 7.

An n-type or p-type conductive layer 17 having a sheet resistance lower than that of the well region 7 is formed in part of a surface layer of the well region 7. An interlayer insulating film 18 made of silicon oxide is formed on the semiconductor substrate 1 between the gate electrode 15 and the source electrode 3. The gate electrode 15 above the well region 7 is connected to the gate line 4 via a gate contact hole 19 formed in the interlayer insulating film 18.

The p-type JTE region 8 is formed in the surface layer of the drift layer 10 on the peripheral side of the well region 7. The impurity concentration of the JTE region 8 is lower than the impurity concentration of the well region 7. A field limiting ring (FLR) may be formed instead of the JTE region 8. Alternatively, both the JTE region 8 and a FLR may be formed.

The gate insulating film 14 and a field insulating film 20 having a film thickness greater than that of the gate insulating film 14 are formed on the well region 7, the conductive layer 17, and the JTE region 8. In a case where a displacement current flows at a sudden voltage rise, the JTE region 8 and the well region 7 serve as a current path and a potential gradient is produced by multiplication of the current by a resistance in the planar direction. The structure is such that the gate electrode 15 extends over the field insulating film 20 such that the insulating film is not broken down by a potential difference from the gate electrode 15 at this time. Note that in a chip having a low withstand voltage of less than or equal to 1200 V, the field insulating film 20 may be omitted. In that case, the gate insulating film 14 is formed under the entire gate electrode 15 in the terminal region, and the gate electrode 15 becomes stepless.

A terminal region contact hole 21 is formed in part of the gate insulating film 14 or the field insulating film 20 and the interlayer insulating film 18 on the conductive layer 17. The conductive layer 17 is in ohmic contact with the source electrode 3 formed thereon through this opening with a terminal portion ohmic electrode 22 interposed therebetween. The width of the conductive layer 17 is greater than the diameter of the terminal region contact hole 21. The terminal region contact hole 21 is a continuous or intermittent hole that surrounds the active region in plan view.

In the active region, the source electrode 3 is formed on the interlayer insulating film 18. The source electrode 3 is connected to the ohmic electrode 13 via an active region contact hole 23 extending through the interlayer insulating film 18 and the gate insulating film 14. A drain electrode 24 is formed on a back surface (a second principal surface) of the semiconductor substrate 1. The gate electrode 15 is electrically insulated from the ohmic electrode 13 and the source electrode 3 by the interlayer insulating film 18.

A surface protection film 25 is formed to cover the source electrode 3, the gate pad 2, the gate line 4, the field insulating film 20, and the interlayer insulating film 18. The surface protection film 25 has openings (not shown) on the source electrode 3 and the gate pad 2. The openings enable the source electrode 3 and the gate pad 2 to be electrically connected to the outside. An organic material such as polyimide, polybenzoxazole, or acrylic resin or an inorganic material such as silicon nitride is used as the material of the surface protection film 25. The surface protection film 25 may be made of a plurality of materials. Note that the front surfaces of the surface protection film 25 and the semiconductor substrate 1 may be covered by resin (not shown) such as silicone gel or epoxy resin.

The surface protection film 25 interferes with dicing of a wafer into chips due to its high viscosity. Thus, the surface protection film 25 does not cover a region having a certain width on the periphery of the front surface of the semiconductor substrate 1, and a peripheral end of the surface protection film 25 is arranged on the inner side of a peripheral end of the semiconductor substrate 1.

In the terminal region, the surface protection film 25 completely covers the field insulating film 20 and the interlayer insulating film 18 exposed from the source electrode 3, the gate pad 2, and the gate line 4. Note that although a peripheral end of the field insulating film 20 and a peripheral end of the interlayer insulating film 18 conform with each other, such a configuration is not necessarily adopted.

In the terminal region, an n-type peripheral well region 9 having an impurity concentration higher than that of the drift layer 10 is formed in the surface layer of the drift layer 10 on the peripheral side of the JTE region 8. The peripheral well region 9 extends from the inner peripheral side to the peripheral side across the peripheral ends of the field insulating film 20 and the interlayer insulating film 18. However, a peripheral end of the peripheral well region 9 is arranged on the inner side of the peripheral end of the surface protection film 25. The peripheral well region 9 is not electrically connected to the constituent elements other than the drift layer 10. Note that in a case where the peripheral end of the field insulating film 20 and the peripheral end of the interlayer insulating film 18 do not conform with each other, the peripheral well region 9 may be provided across the peripheral end of either the field insulating film 20 or the interlayer insulating film 18. The peripheral well region 9 may be provided across the peripheral end of the interlayer insulating film 18 omitting the field insulating film 20.

A method for manufacturing the semiconductor device according to the present embodiment will now be described. First, a substrate having a polytype of 4H and made of low-resistance n-type silicon carbide is prepared. The plane orientation of a front surface of the substrate is the (0001) plane having an off angle. A semiconductor layer having a thickness of 5 to 100 μm and made of n-type silicon carbide is epitaxially grown on the front surface of the substrate at an impurity concentration of $1 \times 10^{15}$ to $1 \times 10^{17}$ cm$^{-3}$ by chemical vapor deposition (CVD). The semiconductor substrate 1 having the n-type drift layer 10 is thereby formed.

Next, an implantation mask is formed by a photoresist, for example, in a predetermined region on the drift layer 10, and Al (aluminum) which is a p-type impurity is ion-implanted. A depth of ion implantation of Al is approximately 0.5 to 3 μm so as not to exceed the thickness of the drift layer 10. The impurity concentration of ion-implanted Al ranges from $1 \times 10^{17}$ to $1 \times 10^{19}$ cm$^{-3}$, which is higher than the impurity concentration of the drift layer 10. Thereafter, the implantation mask is removed. When activating the implanted Al ion by heat treatment which will be described later, the well region 5 is obtained in the active region, and the well region 7 is obtained in the terminal region. The same applies below for the heat treatment after ion implantation, and description thereof is omitted. The ion-implanted region is subjected to the heat treatment to activate the impurity, thereby forming each region.

Next, an implantation mask is formed by a photoresist, for example, on the drift layer 10 in the terminal region, and Al having a p-type impurity concentration is ion-implanted. The depth of ion implantation of Al is approximately 0.5 to 3 μm so as not to exceed the thickness of the drift layer 10. The impurity concentration of ion-implanted Al ranges from $1 \times 10^{16}$ to $1 \times 10^{18}$ cm$^{-3}$, which is higher than the impurity concentration of the drift layer 10 and lower than the impurity concentration of the well region 5. Thereafter, the implantation mask is removed. The region in which Al has been ion-implanted becomes the JTE region 8. Similarly, Al is ion-implanted in a predetermined region at an impurity concentration ranging from $1 \times 10^{18}$ to $1 \times 10^{21}$ cm$^{-3}$ which is higher than the impurity concentration of the well region 5 to form the contact region 12.

Next, an implantation mask is formed by a photoresist, for example, such that a predetermined location on the inner side of the well region 5 in the front surface of the drift layer 10 is opened, and N (nitrogen) which is an n-type impurity is ion-implanted. An ion implantation depth of N shall be smaller than the thickness of the well region 5. The impurity concentration of the ion-implanted N ranges from $1\times10^{18}$ to $1\times10^{21}$ cm$^{-3}$, which is higher than the p-type impurity concentration of the well region 5. A region exhibiting the n-type in the region in which N has been implanted in the present step becomes the source region 11.

Similarly, an implantation mask is formed by a photoresist, for example, such that a predetermined location on the peripheral side of the JTE region 8 in the terminal region is opened, and N (nitrogen) which is an n-type impurity is ion-implanted. The ion implantation depth of N is smaller than the thickness of the well region 5. The impurity concentration of the ion-implanted N ranges from $1\times10^{18}$ to $1\times10^{21}$ cm$^{-3}$. A region exhibiting the n-type in the region in which N has been implanted in the present step becomes the peripheral well region 9.

Similarly, an implantation mask is formed by a photoresist, for example, such that a predetermined location on the inner side of the well region 7 in the terminal region is opened, and N which is an n-type impurity or Al which is a p-type impurity is ion-implanted. In the case of ion-implanting N, the ion implantation depth shall be smaller than the thickness of the well region 5. The impurity concentration of the ion-implanted N or Al ranges from $1\times10^{18}$ to $1\times10^{21}$ cm$^3$, which is higher than the p-type impurity concentration of the well region 5. A region exhibiting the n-type or p-type in the region in which N or Al has been implanted in the present step becomes the conductive layer 17. In the case where the conductive layer 17 is of the n-type, the thickness of the conductive layer 17 should only be smaller than the thickness of the well region 7.

In the case where the conductive layer 17 is of the n-type, the conductive layer 17 may be formed in the same step, with the same thickness, and at the same impurity concentration as those of the source region 11 and the peripheral well region 9, or may be formed in a different step, with a different thickness, and at a different impurity concentration from them. In the case where the conductive layer 17 is of the p-type, the conductive layer 17 may be formed in the same step, with the same thickness, and at the same impurity concentration as those of the contact region 12, or may be formed in a different step, with a different thickness, and at a different impurity concentration from those of the contact region 12.

Next, annealing is performed with a heat treatment device in an atmosphere of inert gas such as argon (Ar) gas at a temperature of 1300 to 1900° C. for 30 seconds to an hour. The ion-implanted N and Al are electrically activated by this annealing.

Next, the field insulating film 20 is formed on the semiconductor layer in a region excluding the active region substantially corresponding to the region in which the well region 5 is formed using a CVD method or photolithography technique, for example. The field insulating film 20 is made of silicon oxide having a film thickness of 0.5 to 2 μm which is greater than the film thickness of the gate insulating film 14.

Next, a front surface of silicon carbide not covered by the field insulating film 20 is thermally oxidized to form a silicon oxide film which is the gate insulating film 14 having a desired thickness. Next, a polycrystalline silicon film having conductivity is formed on the gate insulating film 14 and the field insulating film 20 by the low-pressure CVD method, and the polycrystalline silicon film is patterned to form the gate electrode 15.

Next, the interlayer insulating film 18 having a film thickness greater than that of the gate insulating film and made of silicon oxide is formed by the low-pressure CVD method. The interlayer insulating film 18 may be an insulating film containing B (boron) or P (phosphor), such as borophosphosilicate glasses (BPSG), or may be a multilayer film of BPSG and silicon oxide free from impurities. Note that the field insulating film 20 may be omitted by forming the interlayer insulating film 18 at the same location as the location at which the field insulating film 20 is formed.

Next, the interlayer insulating film 18 and the gate insulating film 14 are etched to form the active region contact hole 23 that reaches the contact region 12 and the source region 11 in the active region as well as the terminal region contact hole 21 that reaches the conductive layer 17 in the terminal region.

Next, a metal film mainly containing Ni is formed by a sputtering method, for example, and then heat treatment at a temperature of 600 to 1100° C. is performed. This causes the metal film mainly containing Ni and the silicon carbide layer in the active region contact hole 23 and the terminal region contact hole 21 to react with each other to form silicide between the silicon carbide layer and the metal film. Next, the remaining metal film other than silicide produced by the reaction is removed by wet etching. The silicide that is left becomes the ohmic electrode 13 and the terminal portion ohmic electrode 22 accordingly.

Next, a metal film mainly containing Ni is formed on the back surface of the semiconductor substrate 1 and subjected to heat treatment to form a back-surface ohmic electrode (not shown) on the back surface of the semiconductor substrate 1.

Next, the interlayer insulating film 18 at a predetermined location on the peripheral side of the JTE region 8 and a position to be the gate contact hole 19 in the terminal region is removed. At this time, the interlayer insulating film 18 on the peripheral side of the field insulating film 20 is also removed.

Next, wiring metal such as Al is formed on the front surface of the substrate treated so far by the sputtering method or vapor deposition method and processed into a predetermined shape by the photolithography technique, thereby forming the source electrode 3 connected to the ohmic electrode 13 and the terminal portion ohmic electrode 22 on the source side as well as the gate pad 2 and the gate line 4 connected to the gate electrode 15. A protection film of polyimide, for example, is formed and processed into a predetermined shape by the photolithography technique, thereby forming the surface protection film 25. Through the above steps, the semiconductor device of the present embodiment is manufactured.

An operation of the semiconductor device of the present embodiment will now be described. Herein, description will be made citing a semiconductor device in which a semiconductor material is 4H-type silicon carbide as an example. A diffusion potential at a pn junction is approximately 2 V.

<Operation in ON State>

A case in which a high voltage is applied to the drain electrode 24 with respect to the source electrode 3, and a positive voltage more than or equal to a threshold value is applied to the gate electrode 15 is called an "ON state". In the ON state, an inversion channel is formed in the channel region, and a path in which electrons as carriers flow is formed between the n-type source region 11 and the n-type separation region 6. Electrons reach the drain electrode 24 from the source electrode 3 by way of the ohmic electrode 13, the source region 11, the channel region, the separation region 6, and the drift layer 10 in accordance with an electrical field formed by the positive voltage applied to the drain electrode 24. Consequently, an ON current flows from the drain electrode 24 to the source electrode 3 by applying the positive voltage to the gate electrode 15. In other words, a main current flows in the active region in the thickness direction of the semiconductor substrate 1. The voltage applied across the source electrode 3 and the drain electrode 24 is called an ON voltage. A value obtained by dividing the ON voltage by the density of the ON current is called an ON resistance, which is equal to the sum of resistances in the path in which the above-described electrons flow. Since the product of squares of the ON resistance and the ON current is equal to a conduction loss consumed when the MOSFET conducts, it is preferable that the ON resistance should be lower.

<Operation in OFF State>

A case in which a high voltage is applied to the drain electrode 24 with respect to the source electrode 3, and a voltage less than or equal to the threshold value is applied to the gate electrode 15 is called an "OFF state". In the OFF state, there are no inversion carriers in the channel region, and an ON current does not flow. The high voltage applied to a load in the ON state is applied across the source electrode 3 and the drain electrode 24 in the MOSFET.

In the case where the MOSFET is in the OFF state, a high electrical field is applied to the vicinity of the interfaces of the pn junctions between the drift layer 10 and the well region 5, between the drift layer 10 and the well region 7, and between the drift layer 10 and the JTE region 8. A voltage applied to the drain electrode 24 when this electrical field reaches a critical electrical field to cause avalanche breakdown is defined as the maximum voltage (avalanche voltage) of the MOSFET. A rated voltage is usually determined such that the MOSFET is used in a voltage range where avalanche breakdown does not occur.

In the OFF state, a depletion layer spreads in a direction from these pn junction interfaces toward the drain electrode 24 (the downward direction in FIG. 3) and in a direction toward the periphery of the drift layer 10 (the direction from the active region toward the terminal region in FIG. 3). The range of the depletion layer spreading from the pn junction interface between the drift layer 10 and the JTE region 8 greatly depends upon the impurity concentration of the JTE region 8. In a case where the impurity concentration of the JTE region 8 is relatively low, the depletion layer spreads largely to the inside of the JTE region 8, and the range of the depletion layer spreading to the drift layer 10 decreases. On the other hand, in a case where the impurity concentration of the JTE region 8 is relatively high, spreading of the depletion layer to the inside of the JTE region 8 is prevented, and the depletion layer spreads largely to the drift layer 10.

Since the impurity concentration of the peripheral well region 9 is high in the front surface of the drift layer 10, the depletion layer spreading from the pn junction interface between the drift layer 10 and the JTE region 8 to the drift layer 10 does not spread beyond the inner end of the peripheral well region 9. At this time, a potential gradient for an applied voltage is formed in the depletion layer spreading from the pn junction interface between the JTE region 8 and the drift layer 10, and the potential gradient is taken over by the interface between the JTE region 8 and the field insulating film 20 and the interface between the drift layer 10 and the field insulating film 20. In addition, forming the peripheral well region 9 prevents the depletion layer from spreading to the peripheral side of the peripheral well region 9. Thus, there is no potential gradient formed in the interface between the drift layer 10 and the surface protection film 25 and in the front surface of the drift layer 10 on the peripheral side of the surface protection film 25, and the potential is the same as the voltage applied to the drain electrode 24. Thus, a high electrical field is not applied to the surface protection film 25 and the outside of the semiconductor device, which prevents insulation deterioration of the surface protection film 25 and surrounding materials of the semiconductor device.

<Operation Under High Humidity>

A case in which the MOSFET is brought into the OFF state under high humidity is considered. Sealing resin formed to cover the semiconductor device may contain moisture. Thus, the front surface of the drift layer 10 on the peripheral side of the surface protection film 25 will be exposed to the moisture in the state having the same potential as the voltage applied to the drain electrode 24. In a case where an $n^+$ layer is formed in the surface layer of the drift layer 10 on the peripheral side of the surface protection film 25, the $n^+$ layer has a strong ionization effect, so that a slight amount of metal when fabricating the MOSFET, such as Ni necessary for forming the ohmic electrode 13 and the terminal portion ohmic electrode 22, is likely to adhere to and remain in the $n^+$ layer. In a case where a high voltage is applied to the drain electrode 24 in such a state, the remaining slight amount of metal and the moisture react with each other to deposit a metal oxide, or silicon carbide and the moisture react with each other with the metal serving as a catalyst to deposit a silicon oxide.

When a foreign substance is deposited on the front surface of the drift layer 10 on the peripheral side of the surface protection film 25, peeling occurs at the interface between the drift layer 10 and the sealing resin. Further, in a case where deposition of the foreign substance in the front surface of the drift layer 10 progresses to the interface between the drift layer 10 and the surface protection film 25, peeling occurs at the interface between the drift layer 10 and the surface protection film 25. The moisture further stays at these peeling portions to form a leak path different from that in an operation of a typical semiconductor device in some cases. Peeling progresses so that electric insulation can no longer be kept in some cases. As a result, insulation performance of the semiconductor device is impaired.

In contrast, in the present embodiment, the peripheral end of the peripheral well region 9 is arranged on the inner side of the peripheral end of the surface protection film 25. Thus, even in a case where an $n^+$ region is not formed in the surface layer of the drift layer 10 on the peripheral side of the surface protection film 25 and a high voltage is applied to the drain electrode 24 under high humidity, deposition of a foreign substance can be prevented. This prevents film peeling from occurring in the surroundings and prevents a leak path different from that in an operation of a typical semiconductor device from being formed, which enables insulation reliability to be kept even in the case where the semiconductor device is used in a humid state.

Figure 4:
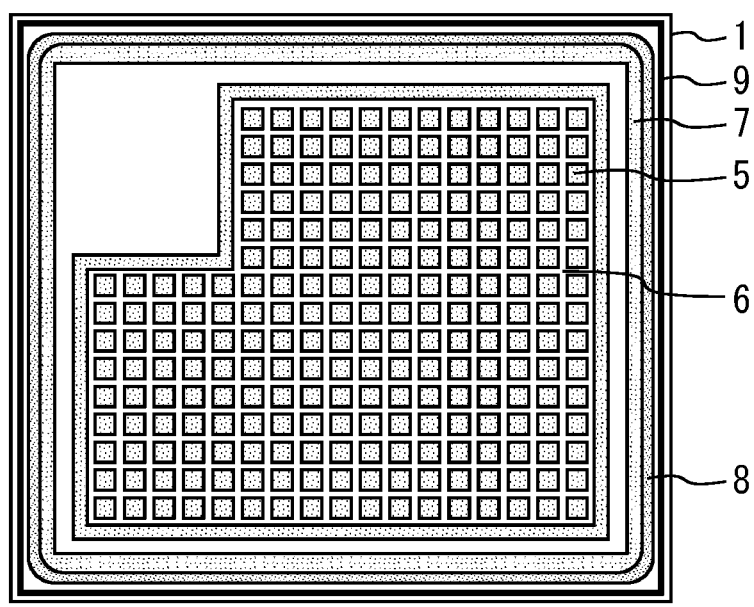
FIG. 4 is a top view showing a semiconductor portion of a first modification example of the semiconductor device according to the first embodiment.

Although the unit cell regions are repeatedly arranged in stripes in plan view in FIG. 2, various modification examples of the active region can be considered. FIG. 4 is a top view showing a semiconductor portion of a first modification example of the semiconductor device according to the first embodiment. Unit cell regions are repeatedly arranged in a grid pattern lengthwise and widthwise in plan view. The terminal region is configured similarly to the foregoing, so that similar effects are exerted.

Figure 5:
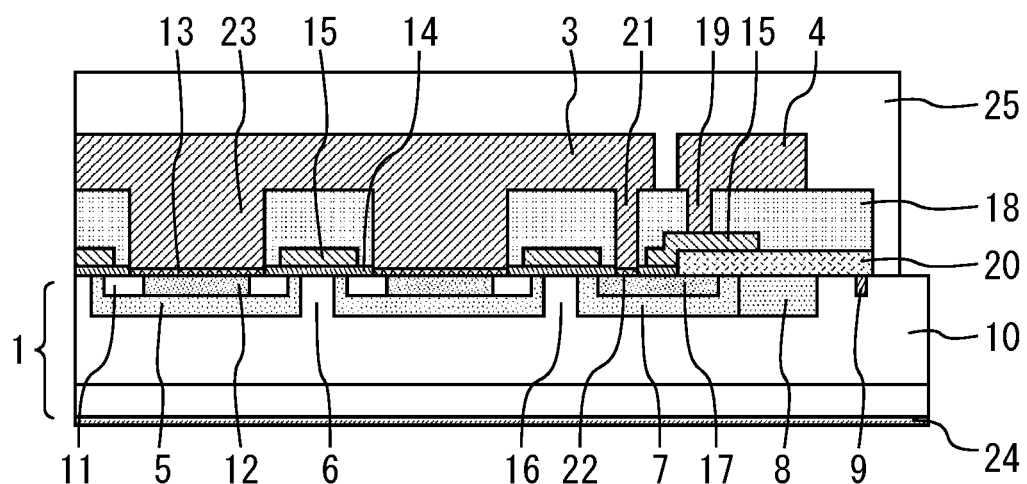
FIG. 5 is a sectional view showing a second modification example of the semiconductor device according to the first embodiment.

FIG. 5 is a sectional view showing a second modification example of the semiconductor device according to the first embodiment. The peripheral end of the peripheral well region 9 is arranged on the inner side of the peripheral ends of the field insulating film 20 and the interlayer insulating film 18. The peripheral well region 9 is covered by the field insulating film 20 and the interlayer insulating film 18, and is not in contact with the surface protection film 25.

In a case where a stress is applied to the semiconductor device due to sealing, for example, while or after the semiconductor device is manufactured, the surface protection film 25 may peel. In a case of sealing the semiconductor device with high-stress epoxy resin, for example, a still higher stress is applied to a chip peripheral portion, and the surface protection film 25 is likely to peel. In a case of sealing the semiconductor device with low-stress silicone gel, for example, the surface protection film 25 may be omitted. Even in such a case, an $n^+$ region is not formed in the surface layer of the drift layer 10 on the peripheral side of the field insulating film 20 and the interlayer insulating film 18 because the peripheral end of the peripheral well region 9 is arranged on the inner side of the peripheral ends of the field insulating film 20 and the interlayer insulating film 18. This can prevent deposition of a foreign substance on the outer side of the field insulating film 20 and the interlayer insulating film 18 in a case where a high voltage is continuously applied in a high humidity environment.

Note that in a case where the peripheral end of the field insulating film 20 and the peripheral end of the interlayer insulating film 18 do not conform with each other, the peripheral end of the peripheral well region 9 is arranged on the inner side of the peripheral end of either the field insulating film 20 or the interlayer insulating film 18. The peripheral end of the peripheral well region 9 may be arranged on the inner side of the peripheral end of the interlayer insulating film 18 omitting the field insulating film 20.

In the peripheral well region 9, the impurity concentration on the front surface side may be higher than that of the drift layer 10, and the impurity concentration on the back surface side may be lower than the impurity concentration on the front surface side and higher than that of the drift layer 10. When the impurity concentration on the back surface side of the peripheral well region 9 is higher than the impurity concentration on the front surface side, a foreign substance is less likely to be deposited on the semiconductor surface. The source region 11 may be formed in the same step, with the same thickness, and at the same impurity concentration as those of the peripheral well region 9, or may be formed in a different step, with a different thickness, and at a different impurity concentration.

Second Embodiment

Figure 6:
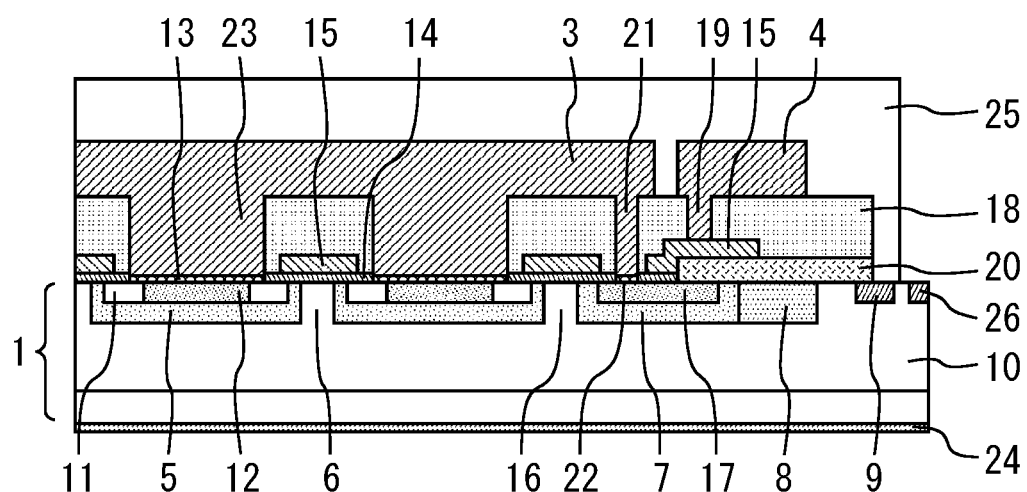
FIG. 6 is a sectional view showing a semiconductor device according to a second embodiment.

FIG. 6 is a sectional view showing a semiconductor device according to a second embodiment. An n-type peripheral well region 26 is formed in the surface layer of the drift layer 10 on the peripheral side of the surface protection film 25 separately from the peripheral well region 9. The peripheral well region 26 has an impurity concentration higher than that of the drift layer 10, and extends to the peripheral end of the drift layer 10. The peripheral well region 26 is not electrically connected to constituent elements other than the drift layer 10. The peripheral well region 26 is an $n^+$ region formed in a test pattern, for example. The other constituent elements are similar to those of the first embodiment.

The peripheral end of the surface protection film 25 is arranged between the peripheral well regions 9 and 26. In other words, the peripheral well regions 9 and 26 are not formed under the peripheral end of the surface protection film 25. Consequently, in a case where a high voltage is applied to the drain electrode 24 under high humidity, a foreign substance is deposited only on a front surface of the peripheral well region 26 which is the $n^+$ region exposed from the surface protection film 25. Since deposition of the foreign substance does not reach the peripheral end of the surface protection film 25, peeling of the surface protection film 25 can be prevented. Insulation reliability can therefore be kept even in the case where the semiconductor device is used in a humid state.

The peripheral well region 9 and the peripheral well region 26 are formed in the same step, with the same thickness, and in the same impurity concentration. In the peripheral well region 26, the impurity concentration on the front surface side may be higher than that of the drift layer 10, and the impurity concentration on the back surface side may be lower than the impurity concentration on the front surface side and higher than that of the drift layer 10. When the impurity concentration on the back surface side of the peripheral well region 26 is higher than the impurity concentration on the front surface side, a foreign substance is less likely to be deposited on the semiconductor surface.

Note that the foreign substance deposited on the front surface of the peripheral well region 26 may be removed by an air flow or immersion in a chemical liquid. In a case where the surface protection film 25 is omitted, the peripheral well region 26 is formed on the outer side of the field insulating film 20 and the interlayer insulating film 18. This can limit deposition of the foreign substance to the outer side of the field insulating film 20 and the interlayer insulating film 18, and prevent peeling of the field insulating film 20 and the interlayer insulating film 18.

Figure 7:
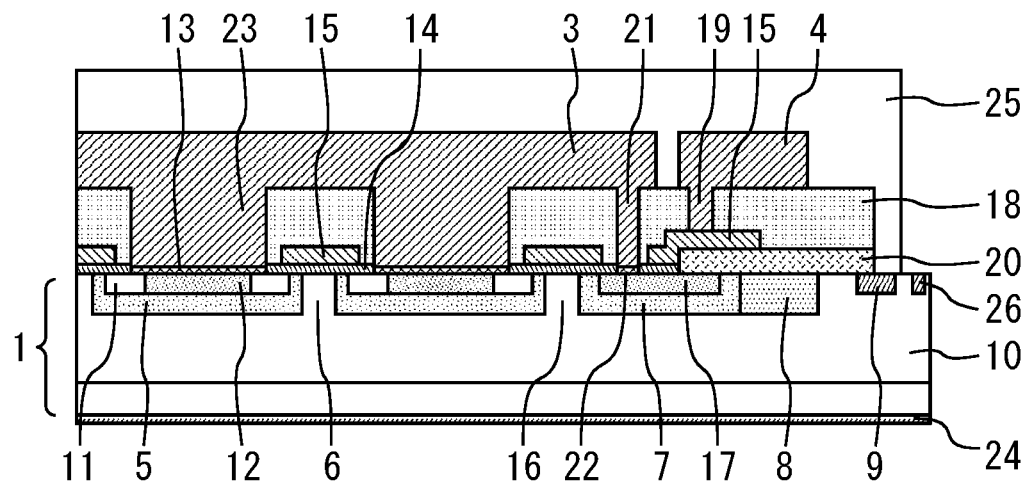
FIG. 7 is a sectional view showing a first modification example of the semiconductor device according to the second embodiment.

FIG. 7 is a sectional view showing a first modification example of the semiconductor device according to the second embodiment. The peripheral well region 26 does not extend to the peripheral end of the semiconductor substrate 1. This prevents deposition of a foreign substance on a chip end where a stress is likely to occur between the chip end and sealing resin, so that peeling of the semiconductor device and the sealing resin can be prevented. The other constituent elements and effects are similar to those of the device shown in FIG. 6.

Figure 8:
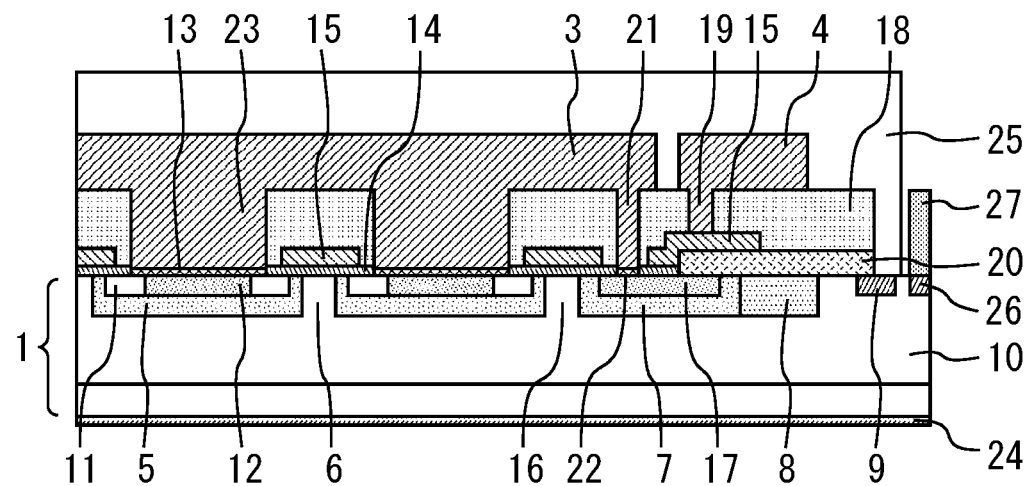
FIG. 8 is a sectional view showing a second modification example of the semiconductor device according to the second embodiment.

FIG. 8 is a sectional view showing a second modification example of the semiconductor device according to the second embodiment. A peripheral insulating film 27 is formed on the semiconductor substrate 1 to cover a part or the whole of the peripheral well region 26. The material of the peripheral insulating film 27 is the same as that of the field insulating film 20 or the interlayer insulating film 18, which is $SiO_2$, for example. The peripheral insulating film 27 may be formed by leaving the field insulating film 20 and the interlayer insulating film 18 unetched on the front surface of the peripheral well region 26. By covering the peripheral well region 26 formed in a test pattern, for example, by the peripheral insulating film 27, a foreign substance is not deposited on the peripheral well region 26.

Figure 9:
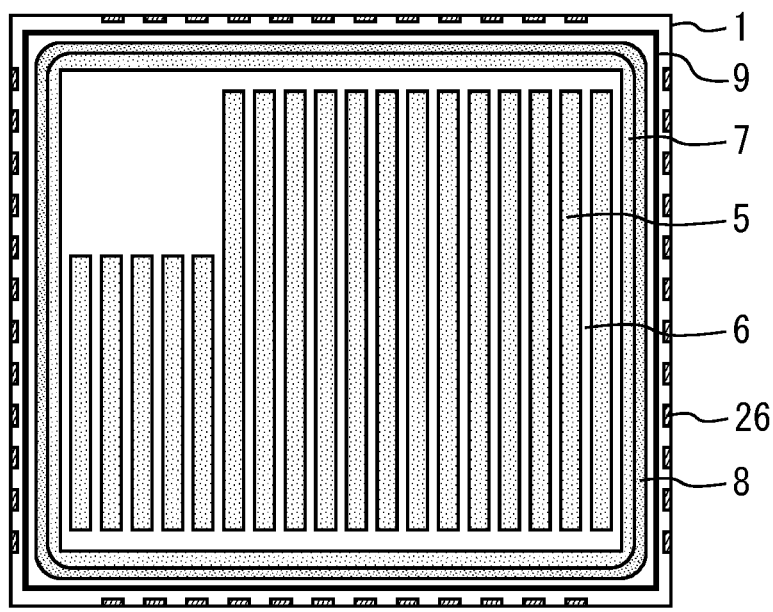
FIG. 9 is a sectional view showing a third modification example of the semiconductor device according to the second embodiment.

FIG. 9 is a sectional view showing a third modification example of the semiconductor device according to the second embodiment. A plurality of peripheral well regions 26 are formed separately in plan view. This reduces the area in which a foreign substance is deposited on the front surface of the peripheral well region 26, which can prevent peeling of the semiconductor device and the sealing resin. The peripheral well regions 26 are not limited to a rectangular layout, but can be laid out variously, and can be formed in a test pattern for checking finish of some constituent elements of the semiconductor device.

A plurality of field insulating films 20 may be formed separately in plan view so as to cover a part or the whole of the plurality of separate peripheral well regions 26. This can prevent deposition of a foreign substance on the front surfaces of the peripheral well regions 26, so that performance as the test pattern can be maintained.

Third Embodiment

Figure 10:
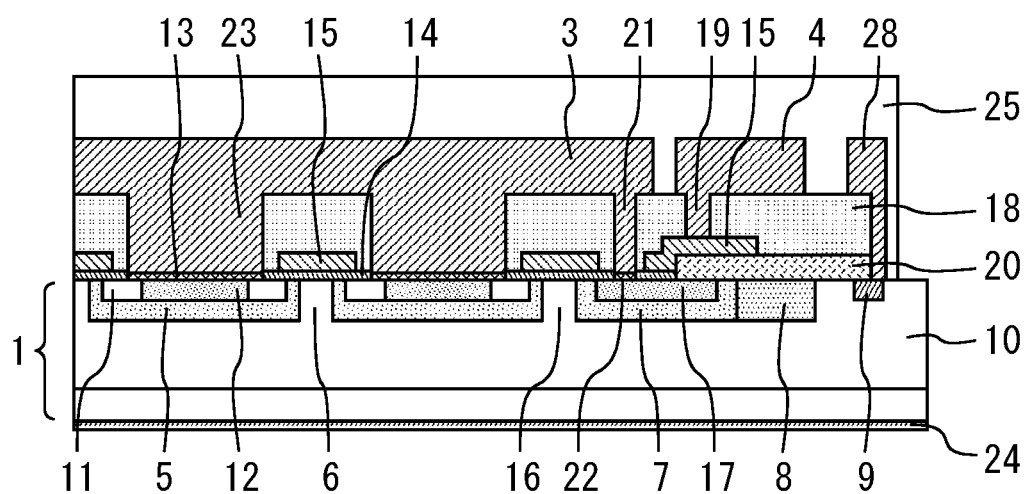
FIG. 10 is a sectional view showing a semiconductor device according to a third embodiment.

FIG. 10 is a sectional view showing a semiconductor device according to a third embodiment. A peripheral electrode 28 is formed on the semiconductor substrate 1, and extends over the peripheral portions of the field insulating film 20 and the interlayer insulating film 18. The peripheral electrode 28 is not electrically connected to constituent elements other than the drift layer 10 and the peripheral well region 9. The peripheral electrode 28 has substantially the same potential as the voltage applied to the drain electrode 24, which can prevent a depletion layer from excessively spreading from the pn junction interface between the JTE region 8 and the drift layer 10.

The surface protection film 25 completely covers the peripheral electrode 28. The peripheral electrode 28 can be formed at the same time when the source electrode 3, the gate pad 2, and the gate line 4 are formed. In the terminal region, the peripheral well region 9 is provided across the peripheral ends of the field insulating film 20 and the interlayer insulating film 18, and the peripheral end of the peripheral well region 9 is arranged on the inner side of a peripheral end of the peripheral electrode 28. In other words, the peripheral well region 9 is at least partially formed under the field insulating film 20 and the interlayer insulating film 18 and not formed under the peripheral end of the peripheral electrode 28. The other constituent elements are similar to those of the first embodiment.

In a case where a stress is applied to the semiconductor device due to sealing while or after the semiconductor device is manufactured, the surface protection film 25 may peel. In a case of sealing the semiconductor device with high-stress epoxy resin, for example, a still higher stress is applied to the surroundings of the peripheral electrode 28, and the surface protection film 25 is more likely to peel. In the case of sealing the semiconductor device with low-stress silicone gel, for example, the surface protection film 25 may be omitted. The peripheral end of the peripheral well region 9 is arranged on the inner side of the peripheral end of the peripheral electrode 28 accordingly. Thus, in a case where an n⁺ region is not formed in the surface layer of the drift layer 10 on the peripheral side of the peripheral electrode 28 and a high voltage is applied to the drain electrode 24 under high humidity, deposition of a foreign substance can also be prevented. This prevents film peeling from occurring in the surroundings, and prevents a leak path different from that in an operation of a typical semiconductor device from being formed, which enables insulation reliability to be kept even in the case where the semiconductor device is used in a humid state.

Note that the n-type peripheral well region 26 having an impurity concentration higher than that of the drift layer 10 may be formed in the surface layer of the drift layer 10 separately from the peripheral well region 9 on the outer side of the peripheral electrode 28. In this case, the peripheral end of the peripheral electrode 28 is arranged between the peripheral well region 9 and the peripheral well region 26. In other words, the peripheral well regions 9 and 26 are not formed under the peripheral end of the peripheral electrode 28. Consequently, a foreign substance is deposited only on the front surface of the peripheral well region 26, and deposition of the foreign substance does not reach the peripheral end of the peripheral electrode 28. This can prevent peeling of the peripheral electrode 28.

Fourth Embodiment

Figure 11:
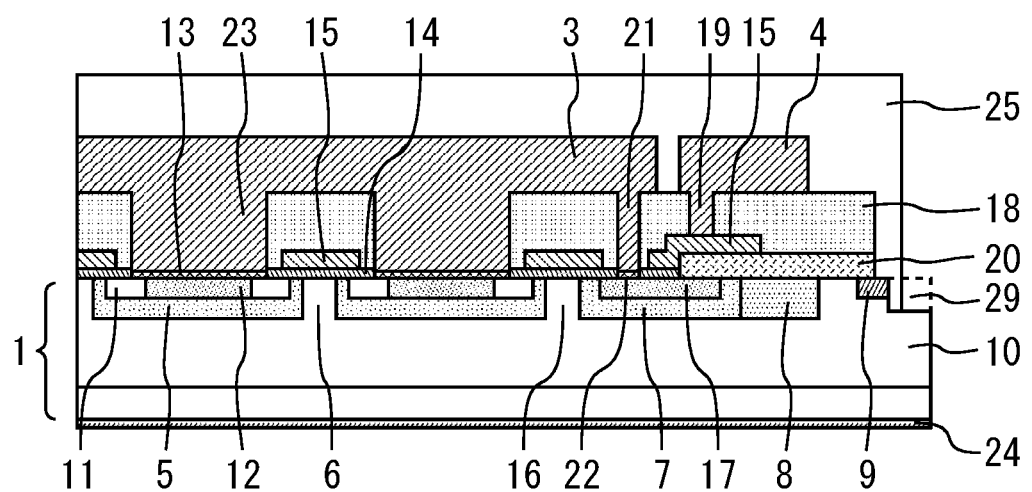
FIG. 11 is a sectional view showing a semiconductor device according to a fourth embodiment.

FIG. 11 is a sectional view showing a semiconductor device according to a fourth embodiment. A stepped portion 29 deeper than the peripheral well region 9 is formed in the front surface of the semiconductor substrate 1 on the outer side of the peripheral well region 9. The stepped portion 29 extends to the peripheral end of the semiconductor substrate 1. The peripheral end of the surface protection film 25 is arranged on the stepped portion 29. Part of the peripheral well region 9 is removed when the stepped portion 29 is formed by etching. Since a remaining part of the peripheral well region 9 is formed on the inner side of the surface protection film 25, a foreign substance is not deposited on the outer side of the surface protection film 25 even in a case where a high voltage is applied to the drain electrode 24 under high humidity.

Figure 12:
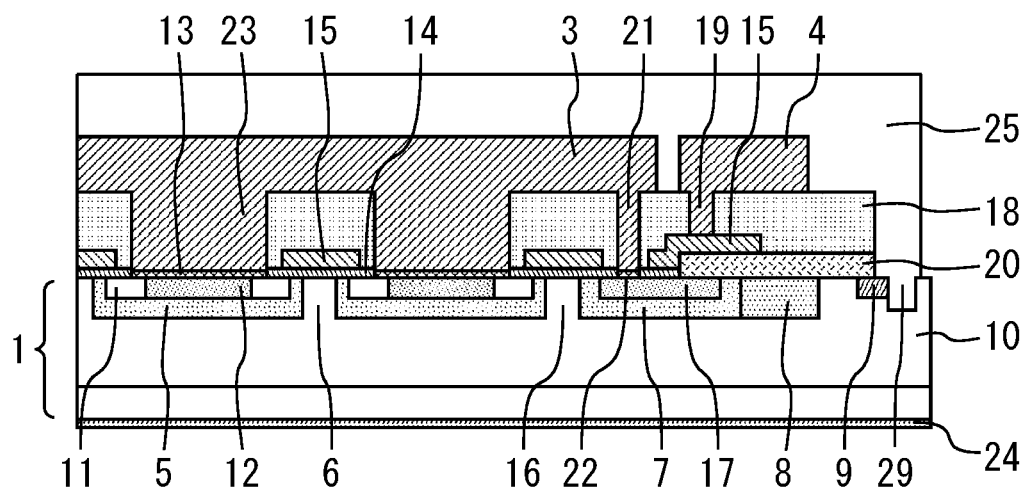
FIG. 12 is a sectional view showing a first modification example of the semiconductor device according to the fourth embodiment.

FIG. 12 is a sectional view showing a first modification example of the semiconductor device according to the fourth embodiment. A peripheral end of the stepped portion 29 is arranged on the inner side of the peripheral end of the semiconductor substrate 1. The peripheral end of the surface protection film 25 is arranged on the outer side of the peripheral end of the stepped portion 29. The other constituent elements and effects are similar to those of the device shown in FIG. 11.

Figure 13:
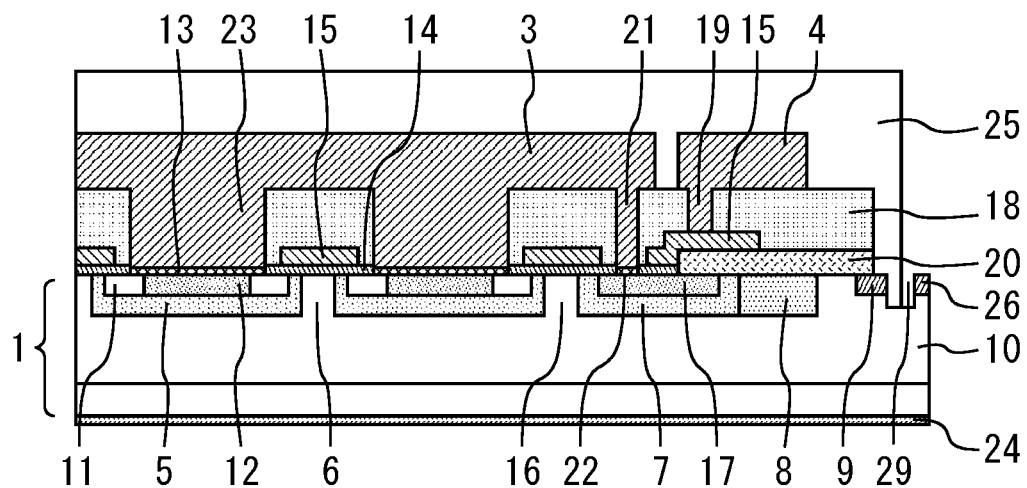
FIG. 13 is a sectional view showing a second modification example of the semiconductor device according to the fourth embodiment.
Figure 14:
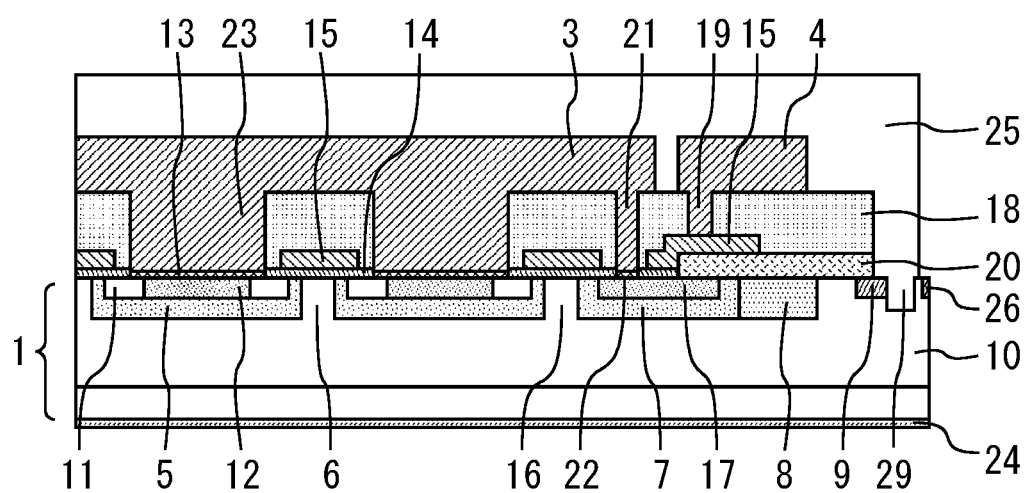
FIG. 14 is a sectional view showing a third modification example of the semiconductor device according to the fourth embodiment.

FIG. 13 is a sectional view showing a second modification example of the semiconductor device according to the fourth embodiment. A peripheral end of the stepped portion 29 is arranged on the inner side of the peripheral end of the semiconductor substrate 1. The peripheral end of the surface protection film 25 is arranged on the stepped portion 29. FIG. 14 is a sectional view showing a third modification example of the semiconductor device according to the fourth embodiment. The peripheral end of the surface protection film 25 is arranged on the outer side of the peripheral end of the stepped portion 29. The peripheral well region 26 is formed in the surface layer of the drift layer 10 on the outer side of the peripheral ends of the stepped portion 29 and the surface protection film 25. Consequently, when a high voltage is applied to the drain electrode 24 under high humidity, a foreign substance is deposited only on the front surface of the peripheral well region 26 which is an n⁺ region exposed from the surface protection film 25. Since deposition of the foreign substance does not reach the peripheral end of the surface protection film 25, peeling of the surface protection film 25 can be prevented.

Figure 15:
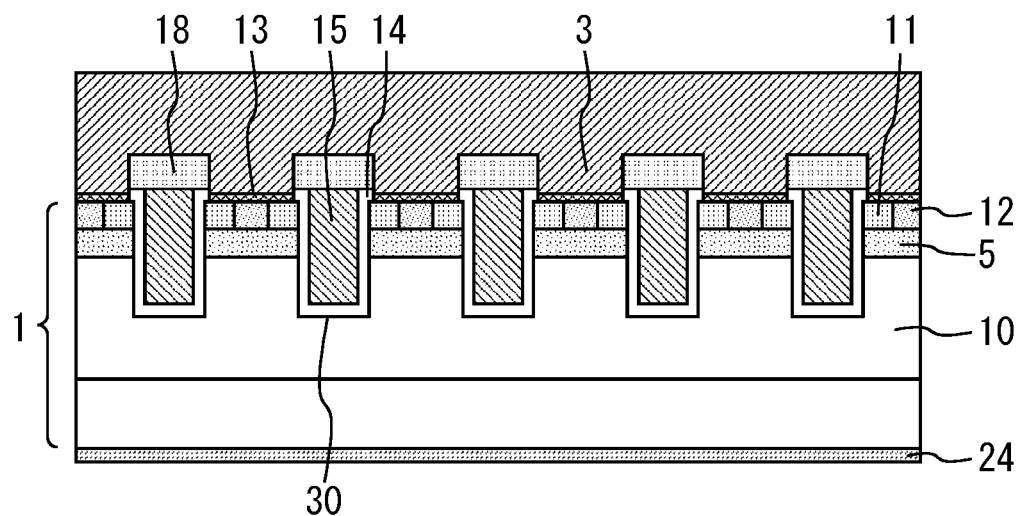
FIG. 15 is a sectional view showing an active region of the semiconductor device according to the fourth embodiment.

FIG. 15 is a sectional view showing an active region of a fourth modification example of the semiconductor device according to the fourth embodiment. In a unit cell region in the active region, a gate trench 30 is formed in the front surface of the drift layer 10 as a trench structure. The gate electrode 15 is formed on the front surface of the drift layer 10 with the gate insulating film 14 interposed therebetween in the gate trench 30. The depth of the stepped portion 29 is greater than the depth of the gate trench 30. Consequently, the n⁺ region of the peripheral well region 9 can be etched by the deep stepped portion 29 while reducing the ON resistance of the active region by the shallow trench structure.

The gate trench 30 and the stepped portion 29 are formed by reactive ion etching, for example. The depth of the stepped portion 29 is greater than the depth of the gate trench 30. Forming the gate trench 30 and the stepped portion 29 in the active region at the same time can reduce manufacturing steps. In the case of using reactive ion etching, for example, the stepped portion 29 having a larger area can be made deeper than the gate trench 30 having a smaller area. Consequently, the stepped portion 29 deeper than the peripheral well region 26 can be formed while decreasing the depth of the gate trench 30 to reduce the ON resistance or an electrical field strength below the gate trench 30. The gate trench 30 and the stepped portion 29 may be formed before or after annealing for electrically activating the ion-implanted N and Al.

Fifth Embodiment

Figure 16:
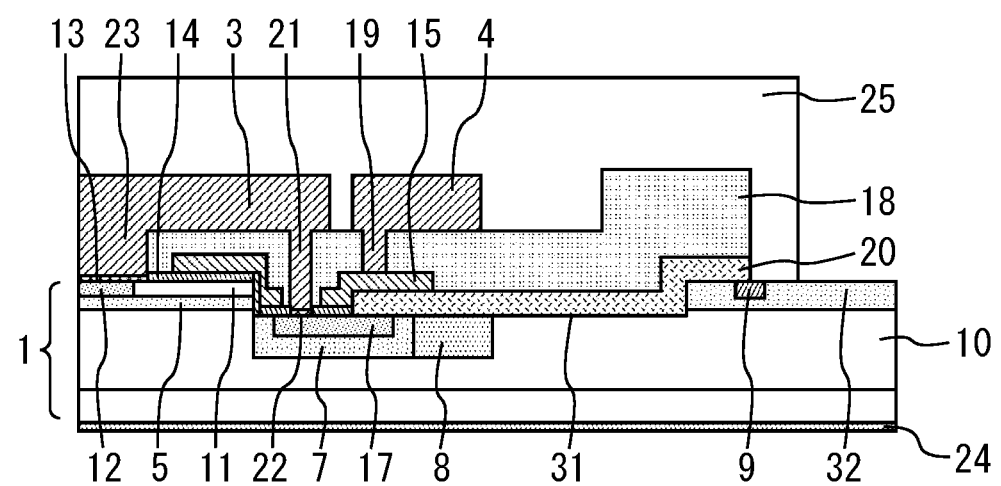
FIG. 16 is a sectional view showing a semiconductor device according to a fifth embodiment.

FIG. 16 is a sectional view showing a semiconductor device according to a fifth embodiment. A terminal trench 31 is formed widely in the terminal region. The terminal trench 31 is formed on the inner side of the peripheral ends of the field insulating film 20 and the interlayer insulating film 18. The well region 7 and the JTE region 8 are formed on the bottom of the terminal trench 31. A p-type surface well region 32 is formed in the surface layer of the drift layer 10 on the periphery of the terminal trench 31. The impurity concentration of the surface well region 32 may be the same as the impurity concentration of the well region 5.

The n-type peripheral well region 9 having an impurity concentration higher than that of the surface well region 32 is formed in the surface well region 32. The peripheral well region 9 is provided across the peripheral ends of the field insulating film 20 and the interlayer insulating film 18, and the peripheral end of the peripheral well region 9 is arranged on the inner side of the peripheral end of the surface protection film 25. Thus, an n⁺ region is not formed in the surface layer of the drift layer 10 on the peripheral side of the surface protection film 25, and deposition of a foreign substance can be prevented even in a case where a high voltage is applied to the drain electrode 24 under high humidity. This can prevent deposition of a foreign substance even in a case where a high voltage is applied to the drain electrode 24 under high humidity in the configuration in which the p-type region is formed on the entire front surface of the semiconductor substrate 1.

Note that in a case where the peripheral end of the field insulating film 20 and the peripheral end of the interlayer insulating film 18 do not conform with each other, the peripheral well region 9 may be provided across the peripheral end of either the field insulating film 20 or the interlayer insulating film 18. The peripheral well region 9 may be provided across the peripheral end of the interlayer insulating film 18 omitting the field insulating film 20.

In the case of a MOSFET having a trench structure in a unit cell region, manufacturing steps can be reduced by forming the gate trench 30 and the terminal trench 31 after forming the p-type region to be the well region 5 and the surface well region 32 at the same time. The terminal trench 31 may be formed at the same time with the gate trench 30. At this time, the steps of manufacturing the semiconductor device can be omitted by forming the gate trench 30 and the terminal trench 31 after forming the p-type region to be the well region 5 and the surface well region 32 on the entire surface layer of the drift layer 10 without performing the photolithography step.

Sixth Embodiment

Hereinafter, a configuration and an operation of a semiconductor device according to a sixth embodiment as well as a method for manufacturing the semiconductor device will be described. The semiconductor device according to the present embodiment is a SBD-embedded MOSFET in which a SBD region is embedded in a MOSFET. The plan view of the semiconductor device according to the present embodiment as seen from the upper surface is the same as that of the MOSFET in FIG. 1.

Figure 17:
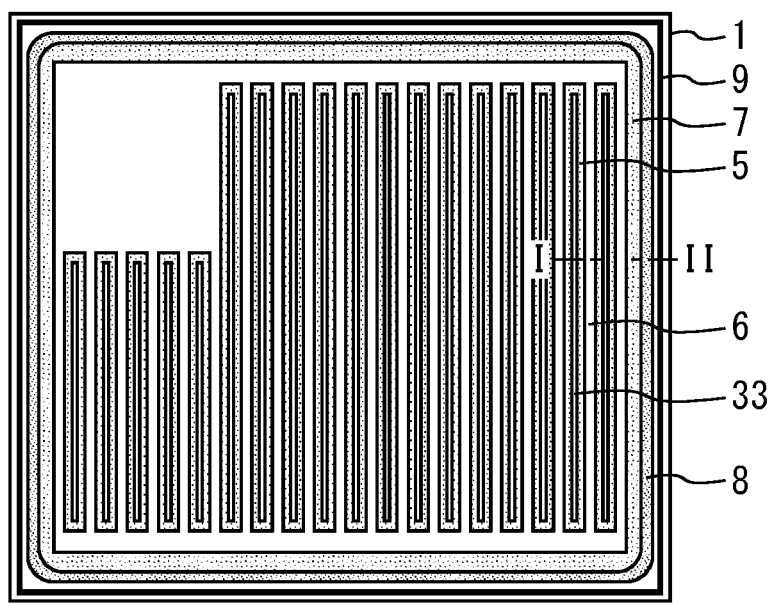
FIG. 17 is a top view showing a semiconductor portion of the semiconductor device according to the sixth embodiment.

FIG. 17 is a top view showing a semiconductor portion of the semiconductor device according to the sixth embodiment. Unit cell regions, each being composed of an n-type separation region 33 and the p-type well region 5, are repeatedly arranged in a single direction in plan view. The separation region 33 substantially corresponds to a SBD region. The p-type well region 5 substantially corresponds to a MOSFET region. Consequently, the unit cell regions, each having MOSFET regions formed on both sides of a SBD region, are formed in line in stripes. A region in which a SBD-embedded MOSFET is formed becomes the active region. A region in which the p-type well region 7, for example, is formed on the peripheral side of the active region becomes the terminal region.

Figure 18:
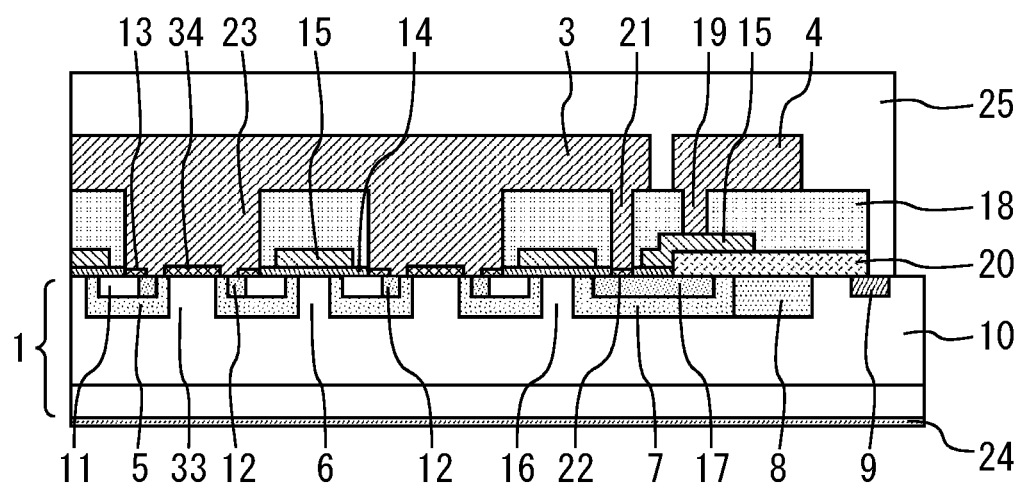
FIG. 18 is a sectional view taken along I-II in FIG. 17.

FIG. 18 is a sectional view taken along I-II in FIG. 17. The separation regions 33 in stripes, each extending through the well region 5, are formed in the surface layer of the drift layer 10 on the inner side of the contact region 12. The n-type impurity concentration of the separation region 33 may be the same as the n-type impurity concentration of the drift layer 10, or may be higher or lower than the n-type impurity concentration of the drift layer 10.

Schottky electrodes 34 in stripes are formed on a front surface side of the separation regions 33. The Schottky electrode 34 is schottky-connected to the separation region 33. It is desirable that the Schottky electrode 34 should be formed to include at least a corresponding one of the separation regions 33 as seen from the upper surface. The ohmic electrode 13 is formed on the front surface of the source region 11. The source electrode 3 is formed on and connected to the ohmic electrode 13, the Schottky electrodes 34, and the contact region 12. The ohmic electrode 13, the Schottky electrodes 34, the source electrode 3, and the gate electrode 15 are electrically insulated from each other by the interlayer insulating film 18. The well region 5 can easily exchange electrons and holes with the ohmic electrode 13 through the low-resistance contact region 12. The other constituent elements are similar to those of the first embodiment.

Figure 19:
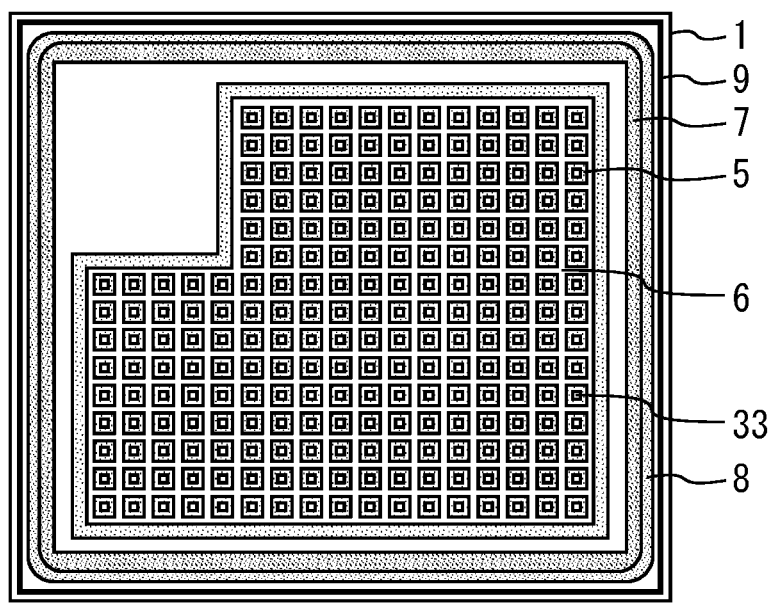
FIG. 19 is a top view showing a first modification example of the semiconductor device according to the sixth embodiment.

Although the MOSFET in which the unit cell regions are repeatedly arranged in stripes in plan view has been described above, various modification examples of the active region can be considered. FIG. 19 is a top view showing a first modification example of the semiconductor device according to the sixth embodiment. In this MOSFET, unit cell regions are repeatedly arranged in a grid pattern lengthwise and widthwise in plan view. In this case, the terminal region has a configuration similar to that of the sixth embodiment, and similar effects are exerted. In the terminal region of the SBD-embedded MOSFET according to the sixth embodiment, each of the configurations shown in the second to fifth embodiments may be adopted.

Figure 20:
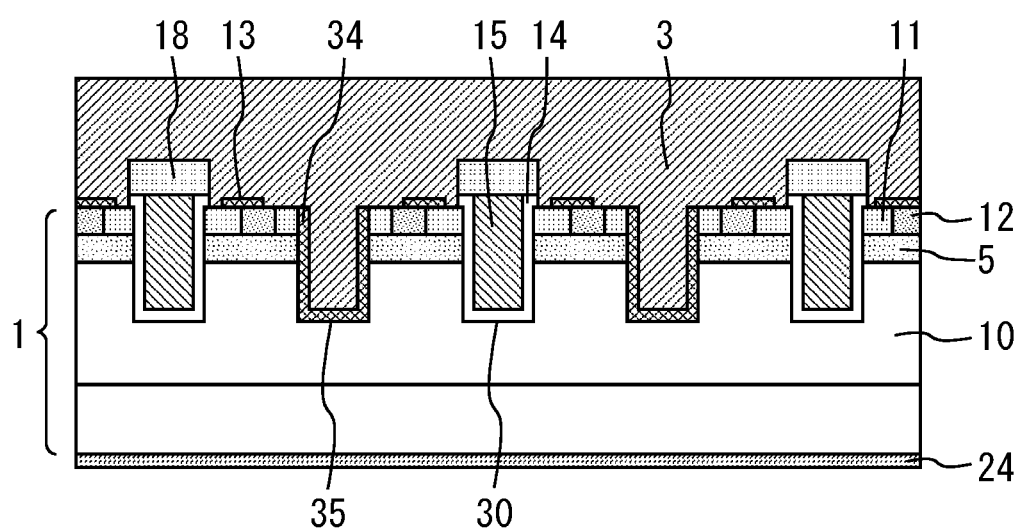
FIG. 20 is a sectional view showing an active region of a second modification example of the semiconductor device according to the sixth embodiment.

FIG. 20 is a sectional view showing an active region of a second modification example of the semiconductor device according to the sixth embodiment. A SBD-embedded MOSFET having a trench structure in a unit cell region in the active region is formed. The gate trenches 30 in stripes and the Schottky trenches 35 in stripes are arranged alternately in parallel to each other. In the gate trench 30, the gate electrode 15 is formed on the front surface of the drift layer 10 with the gate insulating film 14 interposed therebetween. The Schottky electrode 34 is buried in the Schottky trench 35. In a case of adopting the structure shown in the fourth embodiment in the terminal region of the SBD-embedded MOSFET according to the second modification example, the depth of the stepped portion 29 is greater than the depths of the gate trench 30 and the Schottky trench 35.

Figure 21:
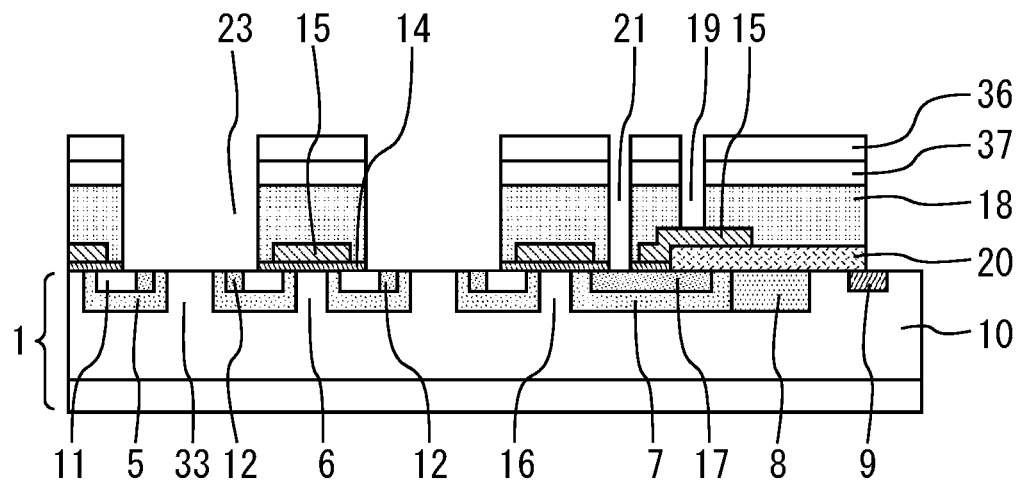
FIG. 21 is a sectional view showing the method for manufacturing the semiconductor device according to the sixth embodiment.
Figure 22:
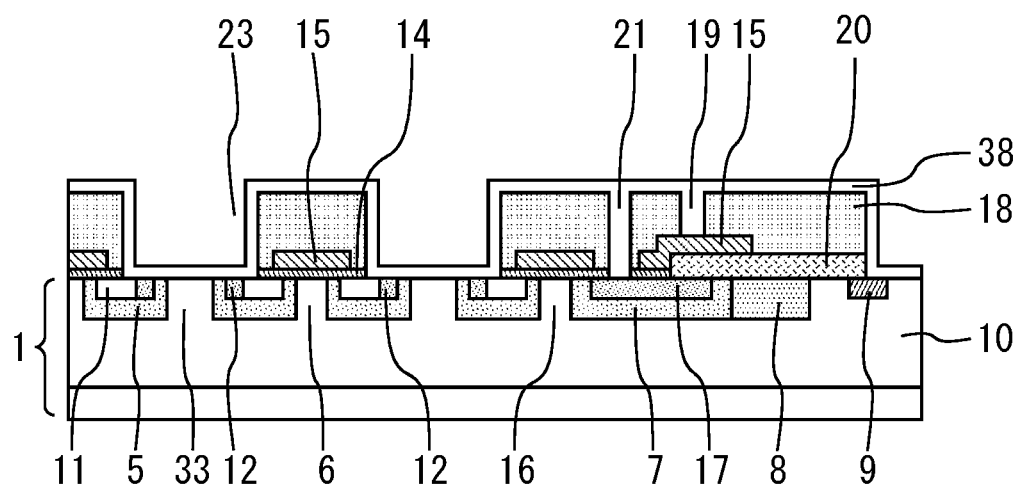
FIG. 22 is a sectional view showing the method for manufacturing the semiconductor device according to the sixth embodiment.

A method for manufacturing the semiconductor device according to the present embodiment will now be described in terms of points different from the first embodiment. FIGS. 21 and 22 are sectional views showing the method for manufacturing the semiconductor device according to the sixth embodiment. When forming the active region contact hole 23 and the terminal region contact hole 21, an insulating film therein at the locations where the Schottky electrodes 34 are to be formed is left.

As shown in FIG. 21, the interlayer insulating film 18 and the gate insulating film 14 on the separation region 33 as well as the interlayer insulating film 18 at the position to be the gate contact hole 19 are removed by etching through use of a resist mask 36. At this time, the interlayer insulating film 18 on the peripheral side of the field insulating film 20 is also removed. As the method for removing, wet etching which does not cause damage to a front surface of the silicon carbide layer to be a Schottky interface is adopted. The interlayer insulating film 18 might be wet-etched in an unintended region due to insufficient adhesion between the front surface of the silicon carbide layer, the ohmic electrode 13, or $SiO_2$ in the interlayer insulating film 18 and the resist mask 36. Thus, a metal mask 37 of Ni, for example, is used under the resist mask 36.

After removing the resist mask 36, a metal film 38 is deposited by the sputtering method, for example, as shown in FIG. 22. The metal film 38 is patterned with a photoresist, for example, to form the Schottky electrode 34 on the separation region 33 in the active region contact hole 23, and heat treatment is performed. The material of the Schottky electrode 34 is Ti or Mo, for example. The other manufacturing steps are similar to those of the first embodiment.

An operation of the semiconductor device of the present embodiment will now be described in terms of different points from the first embodiment. In the ON state, an electrical field (a reverse bias) in a direction in which current is less likely to flow for the Schottky connection, that is, in the reverse direction, is applied to a Schottky junction formed in a contact portion between the separation region 33 and the Schottky electrode 34. Thus, no current flows.

When a bipolar current flows to the pn junction in a backflow state, and a point of origin of a basal plane dislocation, for example, exists at such a location, a stacking fault may extend to increase a resistance during an ON operation. That is to say, the ON voltage increases, and a power loss increases. By embedding a SBD, a forward current which is a bipolar current can be prevented from flowing to the pn junction during backflow, and increase in power loss in the semiconductor device can be prevented.

In the OFF state, an electrical field in the same direction as in the ON state is applied to the Schottky junction formed in the contact portion between the separation region 33 and the Schottky electrode 34, and thus, no current flows ideally. However, since an electrical field much higher than in the ON state is applied, a leak current may be produced. When the leak current is large, heat generation of the MOSFET is increased, and the MOSFET and a module including the MOSFET may be thermally broken down. Thus, it is preferable to reduce the electrical field applied to the Schottky junction in order to reduce the leak current.

In the SBD-embedded MOSFET, a residue of the metal mask 37 or the metal film 38 on the Schottky electrode 34 is likely to remain on the front surface of the drift layer 10 on the peripheral side of the surface protection film 25. Thus, deposition of a foreign substance is promoted in the front surface of the drift layer 10 on the peripheral side of the surface protection film 25 in an operation under high humidity as compared with a MOSFET with no SBD embedded therein. Consequently, the problem in which peeling occurs at the interface between the drift layer 10 and the surface protection film 25 to impair insulation performance of the semiconductor device is noticeable.

In contrast, in the present embodiment, the peripheral end of the peripheral well region 9 is arranged on the inner side of the peripheral end of the surface protection film 25 similarly to the first embodiment. Thus, an $n^+$ region is not formed in the surface layer of the drift layer 10 on the peripheral side of the surface protection film 25, and even in a case where a high voltage is applied to the drain electrode 24 under high humidity, deposition of a foreign substance can be prevented. This prevents film peeling from occurring in the surroundings and prevents a leak path different from that in an operation of a typical semiconductor device from being formed, which enables insulation reliability to be kept even in the case where the semiconductor device is used in a humid state.

By combining the configurations of the modification examples of the first embodiment or the second to fifth embodiments with the SBD-embedded MOSFET according to the present embodiment, effects similar to them are obtained.

Note that the p-type impurity is aluminum (Al) in the above-described embodiments, but may be boron (B) or gallium (Ga). The n-type impurity is not limited to nitrogen (N), but may be phosphor (P). The gate insulating film 14 is not limited to an oxide film of $SiO_2$, for example, but may be an insulating film other than an oxide film or may be a combination of an insulating film other than an oxide film and an oxide film. Although a silicon oxide obtained by thermally oxidizing silicon carbide is used as the gate insulating film 14, silicon oxide deposited by the CVD method may be used. Although the crystalline structure, the plane orientation of the principal surface, the off angle, and respective implantation conditions, for example, have been described in the above embodiments using specific examples, an application range is not limited to their numeric ranges. The semiconductor device may be a SBD-embedded MOSFET having a super junction structure.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor device formed of such a wide-bandgap semiconductor has a high voltage resistance and a high allowable current density, and thus can be miniaturized.

The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

A switching element made up of a wide-bandgap semiconductor can also be used in a high voltage region in which a unipolar operation is difficult with Si semiconductor, and a switching loss occurring in a switching operation can be significantly reduced. This enables significant reduction in power loss. The switching element made up of a wide-bandgap semiconductor is also suitable for a high-frequency switching operation. Thus, in a case where the switching element is applied to a converter circuit greatly requested to be adapted to higher frequencies, increase in switching frequency can also reduce the size of a reactor or capacitor, for example, to be connected to the converter circuit.

Seventh Embodiment

A power conversion device and a method for manufacturing the power conversion device according to a seventh embodiment will be described. In the present embodiment, the semiconductor device according to any one of the above-described first to sixth embodiments is applied to the power conversion device. In the following description, constituent elements similar to the constituent elements described in the first to sixth embodiments will be denoted by the same reference numerals and illustrated, detailed description of which will be omitted. The power conversion device to which the semiconductor device is applied is not limited to a specific application, but hereinafter, a case in which the semiconductor device is applied to a three-phase inverter will be described.

Figure 23:
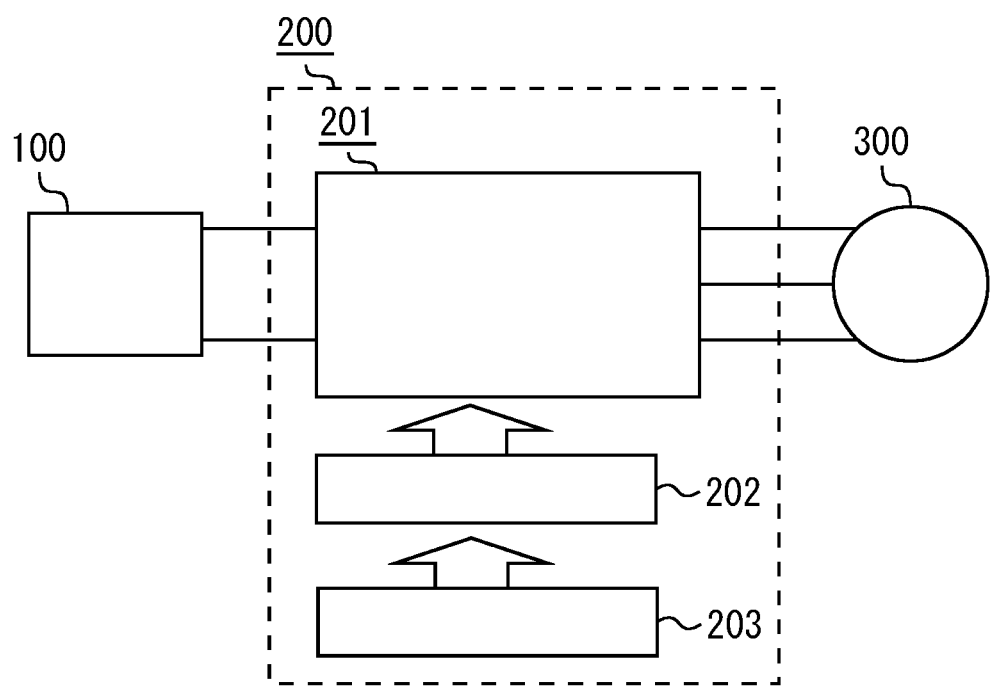
FIG. 23 is a block diagram schematically showing a configuration of a power conversion system including a power conversion device 200 according to the seventh embodiment.

FIG. 23 is a block diagram schematically showing a configuration of a power conversion system including a power conversion device 200 according to the seventh embodiment. The power conversion system includes a power source 100, the power conversion device 200, and a load 300. The power source 100 is a direct current power source, and supplies direct current power to the power conversion device 200. The power source 100 can be implemented variously, and can be implemented by a direct current system, a solar battery, or a storage battery, for example. Alternatively, the power source 100 can be implemented by a rectification circuit or an AC/DC converter connected to an alternating current system. Alternatively, the power source 100 can also be implemented by a DC/DC converter that converts direct current power being output from a direct current system into predetermined power.

The power conversion device 200 is a three-phase inverter connected between the power source 100 and the load 300. The power conversion device 200 converts direct current power supplied from the power source 100 into alternating current power, and supplies the alternating current power to the load 300. The power conversion device 200 includes a main conversion circuit 201 that converts direct current power into alternating current power and outputs the alternating current power, a drive circuit 202 that outputs a drive signal for driving each switching element in the main conversion circuit 201, and a control circuit 203 that outputs a control signal for controlling the drive circuit 202 to the drive circuit 202.

The load 300 is a three-phase electrical motor to be driven by the alternating current power supplied from the power conversion device 200. Note that the load 300 is not limited to a specific intended purpose, but is an electrical motor to be mounted on various types of electric instruments, and is used as an electrical motor intended for a hybrid vehicle, an electric vehicle, a railroad vehicle, an elevator, or an air-conditioning machine, for example.

Hereinafter, details of the power conversion device 200 will be described. The main conversion circuit 201 includes switching elements and freewheeling diodes (not shown). When a switching element performs a switching operation, the main conversion circuit 201 converts the direct current power supplied from the power source 100 into alternating current power, and supplies the alternating current power to the load 300.

Although there are various specific circuit configurations of the main conversion circuit 201, the main conversion circuit 201 according to the present embodiment is a three-phase full-bridge circuit with two levels, and can be made up of six switching elements and six freewheeling diodes connected in antiparallel to the respective switching elements.

The semiconductor device according to any one of the above-described first to sixth embodiments is applied to each switching element in the main conversion circuit 201. The six switching elements are connected two by two in series to constitute upper and lower arms, and each pair of the upper and lower arms constitutes each phase (U-phase, V-phase, and W-phase) of the full-bridge circuit. Output terminals of the respective upper and lower arms, that is, three output terminals of the main conversion circuit 201 are connected to the load 300.

The drive circuit 202 generates a drive signal for driving a switching element of the main conversion circuit 201, and supplies the drive signal to a control electrode of the switching element of the main conversion circuit 201. Specifically, the drive circuit 202 outputs a drive signal for bringing the switching element into the ON state and a drive signal for bringing the switching element into the OFF state to the control electrode of each switching element based on a control signal output from the control circuit 203 which will be described later.

In a case of maintaining the switching element in the ON state, the drive signal is a voltage signal (ON signal) more than or equal to a threshold voltage of the switching element, and in a case of maintaining the switching element in the OFF state, the drive signal is a voltage signal (OFF signal) less than the threshold voltage of the switching element.

The control circuit 203 controls the switching element of the main conversion circuit 201 such that desired power is supplied to the load 300. Specifically, the control circuit 203 calculates a time (ON time) at which each switching element of the main conversion circuit 201 should be brought into the ON state based on power to be supplied to the load 300. For example, the control circuit 203 can control the main conversion circuit 201 by pulse width modulation (PWM) control of modulating the ON time of the switching element in accordance with a voltage to be output.

The control circuit 203 then outputs a control command (control signal) to the drive circuit 202 such that the ON signal is output to a switching element to be brought into the ON state at each point of time and the OFF signal is output to a switching element that should be brought into the OFF state. The drive circuit 202 outputs, as the drive signal, the ON signal or the OFF signal to the control electrode of each switching element based on the control signal.

In the power conversion device 200 according to the present embodiment, the ON resistance after experiencing a current-carrying cycle can be stabilized because the semiconductor device according to any one of the above-described first to sixth embodiments is applied as each switching element of the main conversion circuit 201. When any one of the semiconductor devices according to the first to sixth embodiments is applied to the power conversion device 200 in this manner, the semiconductor device is typically embedded in gel or epoxy resin, for example, in use, however, these materials cannot completely block moisture. Thus, insulation protection of the semiconductor device according to any one of the first to sixth embodiments is maintained. In other words, the reliability of the power conversion device 200 can be increased by applying the semiconductor device according to any one of the first to sixth embodiments.

Note that in the present embodiment, the example of applying the semiconductor device according to any one of the first to sixth embodiments to a three-phase inverter with two levels has been described, but the present disclosure is not limited thereto. The semiconductor device according to any one of the first to sixth embodiments can be applied to various power conversion devices. In the present embodiment, the two-level power conversion device has been described, but the semiconductor device according to any one of the first to sixth embodiments can be applied to a power conversion device with three levels or a multilevel power conversion device. In a case of supplying power to a single-phase load, the semiconductor device according to any one of the first to sixth embodiments can be applied to a single-phase inverter. In a case of supplying power to a direct current load, for example, the semiconductor device according to any one of the first to sixth embodiments can also be applied to a DC/DC converter or an AC/DC converter.

The power conversion device to which the semiconductor device according to any one of the first to sixth embodiments is applied is not limited to the above-described case in which the load is the electrical motor, but can be used as a power source device of an electrical discharge machine, a laser beam machine, an induction heat cooking machine, or a wireless charging system, for example. The power conversion device to which the semiconductor device according to any one of the first to sixth embodiments is applied can also be used as a power conditioner in a solar power system or an electricity storage system, for example.

A method for manufacturing the power conversion device according to the present embodiment will now be described. First, a semiconductor device is manufactured by the manufacturing method described in any one of the first to sixth embodiments. The main conversion circuit 201 having the semiconductor device is then incorporated into the power conversion device 200. The main conversion circuit 201 is a circuit for converting and outputting received power. The drive circuit 202 is then incorporated into the power conversion device 200. The control circuit 203 is then incorporated into the power conversion device 200.

In each of the above-described embodiments, material properties, materials, dimensions, shapes, relative arrangement relations, conditions for implementation, and so forth for the respective constituent elements are also described in some cases, however, these represent mere exemplification in all aspects, and the present disclosure is not limited to those described. Therefore, numerous other modification examples not having been exemplified can be devised without departing from the scope of the present disclosure. For example, cases in which any constituent element is to be modified, added, or omitted, and at least one of the constituent elements in at least one of the embodiments is extracted and combined with constituent elements of another embodiment are involved.

The "one" constituent element described in each of the above embodiments may be "one or more" constituent elements unless inconsistency occurs. Further, individual constituent elements constituting the present disclosure are conceptual units. One constituent element may include a plurality of structural objects, or one constituent element may correspond to part of some structural object. Each constituent element of the present disclosure includes a structural object having a different structure or shape as long as the structural object achieves the same function. Note that according to the present disclosure, the respective embodiments can be arbitrarily combined, or each of the embodiments can be modified or omitted as appropriate within the scope of the disclosure.

Although this disclosure has been described in detail, the foregoing description is illustrative in all aspects and this disclosure are not limit to it. It is understood that numerous variations not illustrated can be envisioned without departing from the scope of this disclosure. Also, the discussion herein is included by reference for all purposes of this disclosure and is not admitted to be prior art unless specifically stated otherwise.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

(Supplementary Note 1)

A semiconductor device comprising:
  a semiconductor substrate having a drift layer of a first conductivity type;
  an active region in which a main current flows in a thickness direction of the semiconductor substrate;
  a terminal region of a second conductivity type formed in a surface layer of the drift layer and surrounding the active region;
  a covering material covering the terminal region; and
  a peripheral well region of a first conductivity type formed in the surface layer of the drift layer on an outer side of the terminal region and having an impurity concentration higher than that of the drift layer,
  wherein a peripheral end of the covering material is arranged on an inner side of a peripheral end of the semiconductor substrate, and
  the peripheral well region is at least partially formed under the covering material and not formed under a peripheral end of the covering material.

(Supplementary Note 2)

The semiconductor device according to Supplementary Note 1, further comprising a front surface electrode connected to the active region and formed on the semiconductor substrate,
  wherein the covering material includes an insulating film covering the terminal region and a surface protection film covering the insulating film and the front surface electrode, and the peripheral well region is not formed under a peripheral end of the surface protection film.

(Supplementary Note 3)

The semiconductor device according to Supplementary Note 2, wherein a peripheral end of the peripheral well region is arranged on an inner side of a peripheral end of the insulating film.

(Supplementary Note 4)

The semiconductor device according to Supplementary Note 1, wherein the covering material includes an insulating film covering the terminal region and a peripheral electrode formed on the semiconductor substrate and extending over a peripheral portion of the insulating film, and the peripheral well region is at least partially formed under the insulating film and not formed under a peripheral end of the peripheral electrode.

(Supplementary Note 5)

The semiconductor device according to any one of Supplementary Notes 1 to 4, wherein the peripheral well region includes a first peripheral well region formed under the covering material and a second peripheral well region formed on a peripheral side of the covering material separately from the first peripheral well region.

(Supplementary Note 6)

The semiconductor device according to Supplementary Note 5, wherein the second peripheral well region does not extend to a peripheral end of the semiconductor substrate.

(Supplementary Note 7)

The semiconductor device according to Supplementary Note 5 or 6, further comprising a peripheral insulating film covering the second peripheral well region.

(Supplementary Note 8)

The semiconductor device according to any one of Supplementary Notes 1 to 7, wherein a stepped portion deeper than the peripheral well region is formed in a front surface of the semiconductor substrate on an outer side of the peripheral well region.

(Supplementary Note 9)

The semiconductor device according to Supplementary Note 8, wherein a transistor having a trench structure is formed in the active region, and a depth of the stepped portion is greater than a depth of the trench structure.

(Supplementary Note 10)

The semiconductor device according to any one of Supplementary Notes 1 to 9, further comprising a surface well region of a second conductivity type formed in a surface layer of the semiconductor substrate from an inner side of a peripheral end of the covering material to a peripheral end of the semiconductor substrate, wherein the peripheral well region is formed in a surface layer of the surface well region.

(Supplementary Note 11)

The semiconductor device according to any one of Supplementary Notes 1 to 10, wherein a SBD region and a MOSFET region are formed in the active region.

(Supplementary Note 12)

The semiconductor device according to any one of Supplementary Notes 1 to 11, wherein the semiconductor substrate is formed of a wide-bandgap semiconductor.

(Supplementary Note 13)

An electric power conversion device comprising:

a main conversion circuit including the semiconductor device according to any one of Supplementary Notes 1 to 12, converting input power and outputting converted power;

a drive circuit outputting a drive signal for driving the semiconductor device to the semiconductor device; and a control circuit outputting a control signal for controlling the drive circuit to the drive circuit.

(Supplementary Note 14)

A method for manufacturing the semiconductor device according to Supplementary Note 2, wherein a metal mask is used when the insulating film is patterned.

(Supplementary Note 15)

A method for manufacturing the semiconductor device according to Supplementary Note 11, wherein a metal film is formed on a front surface of the semiconductor substrate and heat treatment is performed to form a Schottky electrode of the SBD region.

REFERENCE SIGNS LIST 1 semiconductor substrate; 3 source electrode (front surface electrode); 7 well region (terminal region); 8 JTE region (terminal region); 9, 26 peripheral well region; 10 drift layer; 18 interlayer insulating film (covering material); 20 field insulating film (covering material); 25 surface protection film (covering material); 27 peripheral insulating film; 28 peripheral electrode (covering material); 29 stepped portion; 30 gate trench (trench structure); 32 surface well region; 34 Schottky electrode; 37 metal mask, 38 metal film; 201 main conversion circuit; 202 drive circuit; 203 control circuit

The invention claimed is:

1. A semiconductor device comprising:
a semiconductor substrate having a drift layer of a first conductivity type;
an active region in which a main current flows in a thickness direction of the semiconductor substrate;
a terminal region of a second conductivity type formed in a surface layer of the drift layer and surrounding the active region;
a covering material covering the terminal region; and
a peripheral well region of a first conductivity type formed in the surface layer of the drift layer on an outer side of the terminal region and having an impurity concentration higher than that of the drift layer,
wherein a peripheral end of the covering material is arranged on an inner side of a peripheral end of the semiconductor substrate, and
the peripheral well region is at least partially formed under the covering material and not formed under a peripheral end of the covering material.

2. The semiconductor device according to claim 1, further comprising a front surface electrode connected to the active region and formed on the semiconductor substrate,
wherein the covering material includes an insulating film covering the terminal region and a surface protection film covering the insulating film and the front surface electrode, and
the peripheral well region is not formed under a peripheral end of the surface protection film.

3. The semiconductor device according to claim 2, wherein a peripheral end of the peripheral well region is arranged on an inner side of a peripheral end of the insulating film.

4. The semiconductor device according to claim 1, wherein the covering material includes an insulating film covering the terminal region and a peripheral electrode formed on the semiconductor substrate and extending over a peripheral portion of the insulating film, and the peripheral well region is at least partially formed under the insulating film and not formed under a peripheral end of the peripheral electrode.

5. The semiconductor device according to claim 1, wherein the peripheral well region includes a first peripheral well region formed under the covering material and a second peripheral well region formed on a peripheral side of the covering material separately from the first peripheral well region.

6. The semiconductor device according to claim 5, wherein the second peripheral well region does not extend to a peripheral end of the semiconductor substrate.

7. The semiconductor device according to claim 5, further comprising a peripheral insulating film covering the second peripheral well region.

8. The semiconductor device according to claim 1, wherein a stepped portion deeper than the peripheral well region is formed in a front surface of the semiconductor substrate on an outer side of the peripheral well region.

9. The semiconductor device according to claim 8, wherein a transistor having a trench structure is formed in the active region, and
a depth of the stepped portion is greater than a depth of the trench structure.

10. The semiconductor device according to claim 1, further comprising a surface well region of a second conductivity type formed in a surface layer of the semiconductor substrate from an inner side of a peripheral end of the covering material to a peripheral end of the semiconductor substrate,
wherein the peripheral well region is formed in a surface layer of the surface well region.

11. The semiconductor device according to claim 1, wherein a SBD region and a MOSFET region are formed in the active region.

12. The semiconductor device according to claim 1, wherein the semiconductor substrate is formed of a wide-bandgap semiconductor.

13. An electric power conversion device comprising:
a main conversion circuit including the semiconductor device according to claim 1, converting input power and outputting converted power;
a drive circuit outputting a drive signal for driving the semiconductor device to the semiconductor device; and
a control circuit outputting a control signal for controlling the drive circuit to the drive circuit.

14. A method for manufacturing the semiconductor device according to claim 2, wherein a metal mask is used when the insulating film is patterned.

15. A method for manufacturing the semiconductor device according to claim 11, wherein a metal film is formed on a front surface of the semiconductor substrate and heat treatment is performed to form a Schottky electrode of the SBD region.

* * * * *